US012568695B2

(12) United States Patent
Yamamoto et al.

(10) Patent No.: US 12,568,695 B2
(45) Date of Patent: Mar. 3, 2026

(54) TANDEM SOLAR CELL

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Kanagawa (JP); Soichiro Shibasaki, Tokyo (JP); Yuya Honishi, Saitama (JP); Naoyuki Nakagawa, Tokyo (JP); Yukitami Mizuno, Tokyo (JP); Mutsuki Yamazaki, Kanagawa (JP); Yasutaka Nishida, Tokyo (JP)

(73) Assignees: KABUSHIKI KAISHA TOSHIBA, Tokyo (JP); TOSHIBA ENERGY SYSTEMS & SOLUTIONS CORPORATION, Kanagawa (JP)

( * ) Notice: Subject to any disclaimer, the term of this patent is extended or adjusted under 35 U.S.C. 154(b) by 199 days.

(21) Appl. No.: 18/175,739

(22) Filed: Feb. 28, 2023

(65) Prior Publication Data

US 2023/0231065 A1      Jul. 20, 2023

Related U.S. Application Data

(63) Continuation of application No. PCT/JP2021/022107, filed on Jun. 10, 2021.

(51) Int. Cl.
| | |
|---|---|
| *H10F 19/90* | (2025.01) |
| *H10F 19/40* | (2025.01) |
| *H10F 77/00* | (2025.01) |

(52) U.S. Cl.
CPC ........... *H10F 19/902* (2025.01); *H10F 19/40* (2025.01); *H10F 77/935* (2025.01)

(58) Field of Classification Search
None
See application file for complete search history.

(56) References Cited

U.S. PATENT DOCUMENTS

| | | | |
|---|---|---|---|
| 6,353,175 B1 | 3/2002 | Fraas | |
| 8,569,613 B1 * | 10/2013 | Brown | .................. H10F 19/902 |
| | | | 438/93 |

(Continued)

FOREIGN PATENT DOCUMENTS

| | | |
|---|---|---|
| CN | 108666373 | 10/2018 |
| EP | 3127167 | 3/2020 |

(Continued)

OTHER PUBLICATIONS

Japanese Notice Of Allowance for Japanese Patent Application No. 2022-550401 mailed Jul. 30, 2024.

(Continued)

*Primary Examiner* — Dustin Q Dam
(74) *Attorney, Agent, or Firm* — Amin, Turocy & Watson, LLP

(57) ABSTRACT

A tandem solar cell according to an embodiment includes a top cell string, a bottom cell string, a top cell module, a first string connection, a bottom cell module, and a second string connection. The top cell string is formed by electrically connecting a plurality of top cells. The bottom cell string is formed by electrically connecting a plurality of bottom cells. The bottom cell string is arranged so as to overlap the top cell string in a plan view in a thickness direction of the top cell. The first string connection includes a first extending portion extending to an outside of the top cell module in the plan view. A plurality of bottom cell strings are electrically connected to the bottom cell module. The first extending portion and the second extending portion are arranged apart from each other in the plan view.

20 Claims, 23 Drawing Sheets

(56)  References Cited

U.S. PATENT DOCUMENTS

| | | | |
|---|---|---|---|
| 2006/0180197 A1* | 8/2006 | Gui | H01G 9/2072 |
| | | | 257/E25.007 |
| 2010/0018568 A1 | 1/2010 | Nakata | |
| 2010/0078056 A1 | 4/2010 | Hovel | |
| 2011/0017257 A1 | 1/2011 | Lee et al. | |
| 2017/0323993 A1 | 11/2017 | Bjork et al. | |
| 2018/0083151 A1 | 3/2018 | Shibasaki et al. | |
| 2018/0233612 A1 | 8/2018 | Takamoto | |
| 2020/0035849 A1 | 1/2020 | Honishi et al. | |
| 2020/0091357 A1 | 3/2020 | Shibasaki et al. | |

FOREIGN PATENT DOCUMENTS

| | | |
|---|---|---|
| JP | 08-226210 | 9/1996 |
| JP | 2017-534184 | 11/2017 |
| JP | 2018-157176 | 10/2018 |
| JP | 2020-053669 | 4/2020 |
| WO | 2008/059593 | 5/2008 |
| WO | 2022/059134 | 3/2022 |
| WO | 2022/059366 | 3/2022 |

OTHER PUBLICATIONS

Extended European Search Report for European Patent Application No. 21869053.5 dated Aug. 6, 2024.

International Search Report and Written Opinion for International Application No. PCT/JP2021/022107 mailed on Aug. 31, 2021, 12 pgs.

Extended European Search Report for European Patent Application No. 21945135.8 dated Jan. 8, 2025.

\* cited by examiner

FIG. 23

TANDEM SOLAR CELL

CROSS-REFERENCE TO RELATED APPLICATION

This application is a Continuation of and claims the benefit of priority from PCT Application No. PCT/JP2021/022107, filed Jun. 10, 2021; the entire contents of (all of) which are incorporated herein by reference.

FIELD

Embodiments of the present invention relate to a tandem solar cell.

BACKGROUND

A tandem solar cell that includes a top cell and a bottom cell is conventionally known. The tandem solar cell can efficiently generate power in a small area by combining a top cell and a bottom cell made of materials having light absorption bands different from each other.

The tandem solar cell may have a two-terminal structure in which a top cell and a bottom cell are connected in series, a four-terminal structure in which a top cell and a bottom cell are electrically separated, or the like. In the case of the two-terminal structure, there is a constraint on current matching that the photocurrents flowing in the top and bottom cells must match, so there is a disadvantage that the amount of power generation decreases significantly when the angle of incidence of sunlight or the weather deviates from the optimum irradiation conditions. On the other hand, in the case of the four-terminal structure, there is no restriction on current matching, so there is an advantage that the amount of power generation is greater than that of the two-terminal structure, especially when the sunlight is out of the optimum irradiation conditions (they are equivalent under the optimum irradiation conditions).

In the four-terminal structure tandem solar cell, the top cell and the bottom cell need to be insulated from each other. In the four-terminal solar cell module in which a top cell module in which a plurality of top cells are arranged and a bottom cell module in which a plurality of bottom cells are arranged are stacked, the top cell module and the bottom cell module are insulated from each other.

When forming a top cell (bottom cell) module by arranging a plurality of top cells (bottom cells), in many cases, the top cells (bottom cells) are arranged in strips in one direction to form a top cell (bottom cell) string that is electrically connected, and both ends of each top cell (each bottom cell) string in the connecting direction are connected with a string connection. Since the string connections of the top cell module and the bottom cell module are close to each other in the thickness direction of the tandem solar cell, it is necessary to insulate the string connections reliably from each other.

By providing an insulating structure that insulates the string connections from each other, the structure of the tandem solar cell may become complicated or the tandem solar cell may become large.

SUMMARY

The tandem solar cell of the embodiment includes a top cell string, a bottom cell string, a top cell module, a first string connection, a bottom cell module, and a second string connection. The top cell string is formed by electrically connecting a plurality of top cells. The bottom cell string is formed by electrically connecting a plurality of bottom cells. The bottom cell string is arranged so as to overlap the top cell string in a plan view in a thickness direction of the top cell. The first string connection includes a first extending portion extending to an outside of the top cell module in the plan view. A plurality of bottom cell strings are electrically connected to the bottom cell module. The first extending portion and the second extending portion are arranged apart from each other in the plan view.

BRIEF DESCRIPTION OF THE DRAWINGS

FIG. 23 is a cross-sectional view showing an example of a crystalline silicon solar cell that can be used in each embodiment and each modification.

EMBODIMENTS

Figure 1:
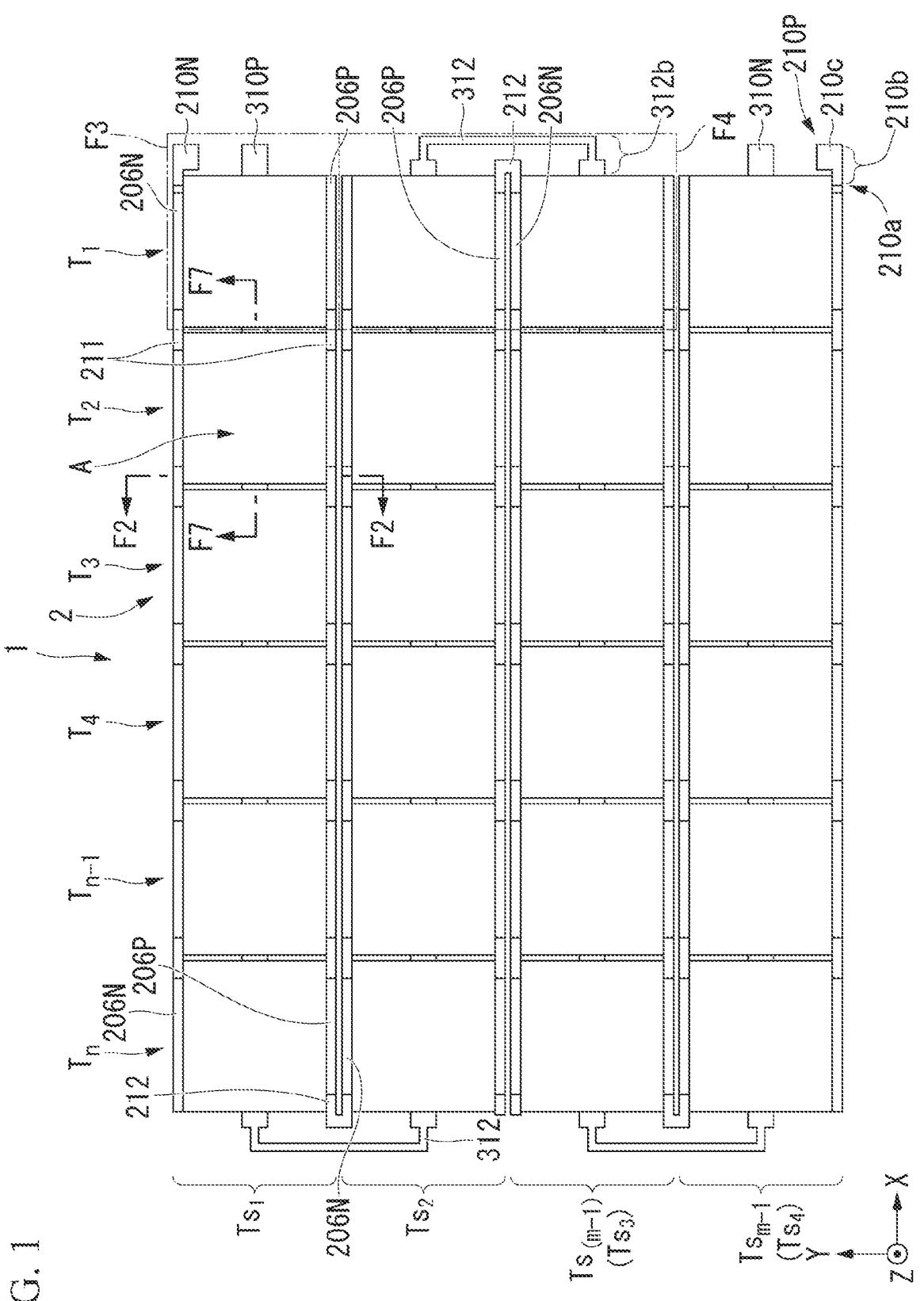
FIG. 1 is a plan view showing an example of a tandem solar cell according to a first embodiment.

The tandem solar cell of the embodiment will be described below with reference to the drawings. In the following figures, the same reference numerals are given to the same or corresponding configurations unless otherwise specified.

First Embodiment

The tandem solar cell of the first embodiment will be described.

Figure 2:
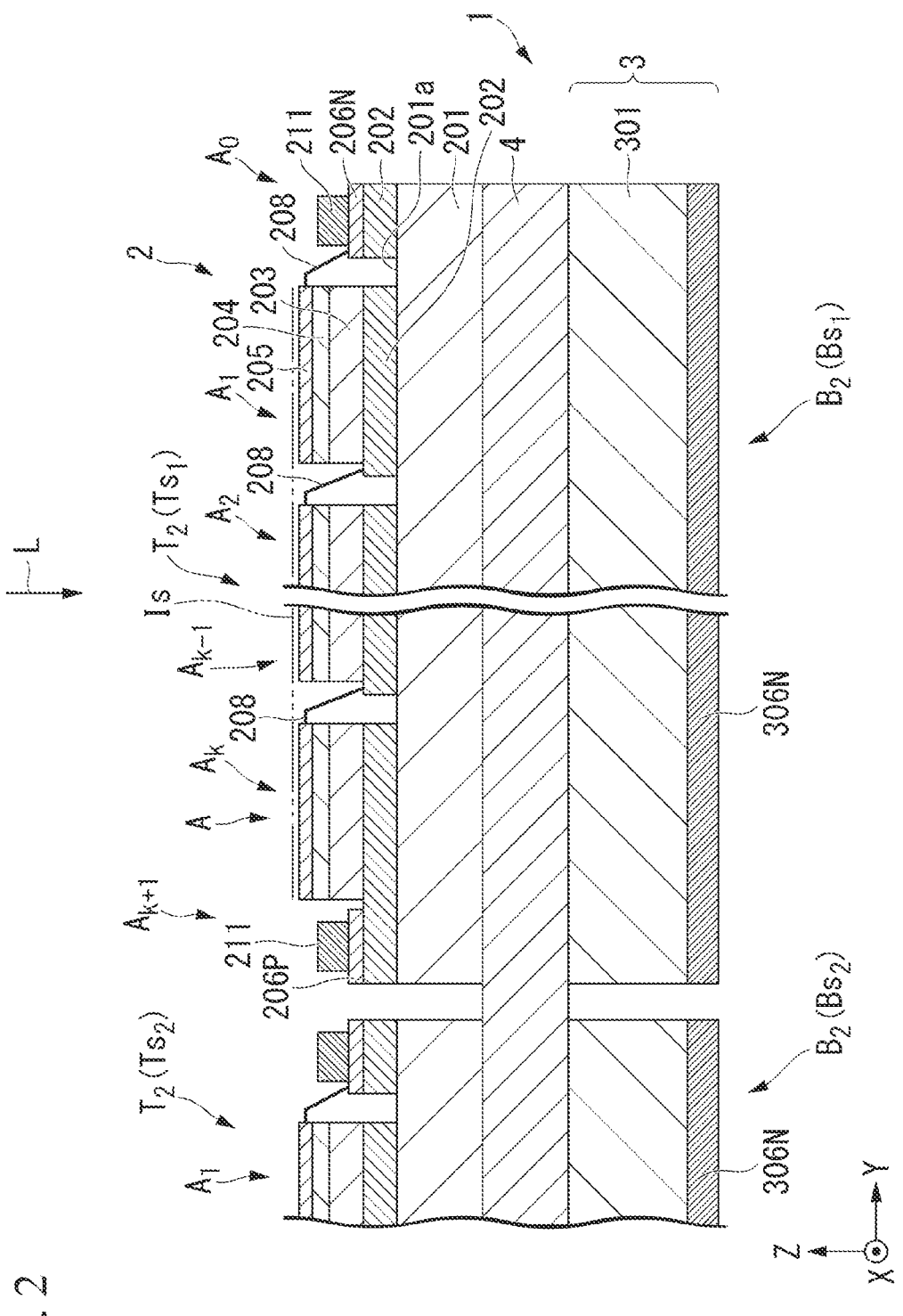
FIG. 2 is a sectional view taken along line F2-F2 in FIG. 1.
Figure 3:
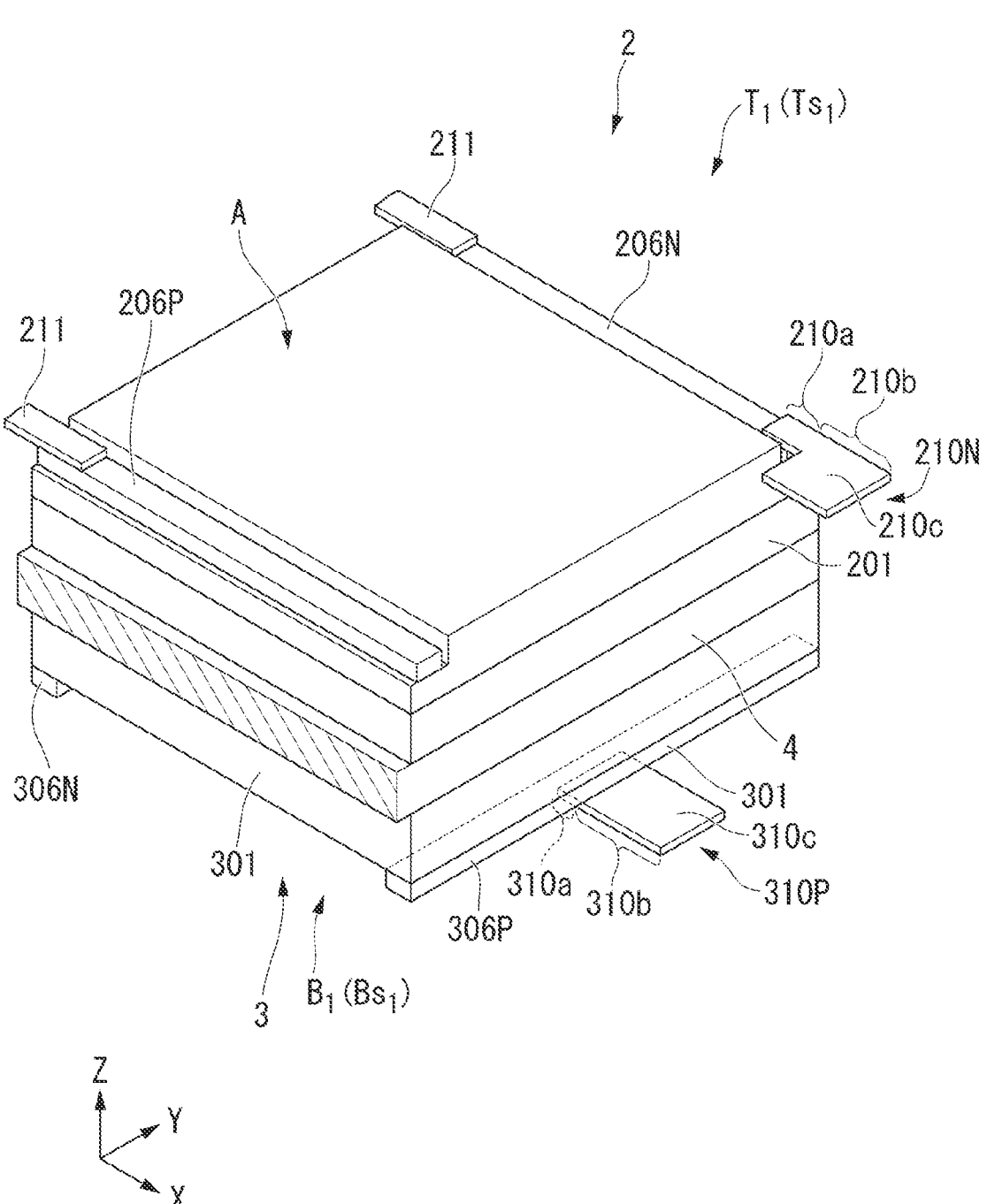
FIG. 3 is a perspective view of the F3 portion in FIG. 1.
Figure 4:
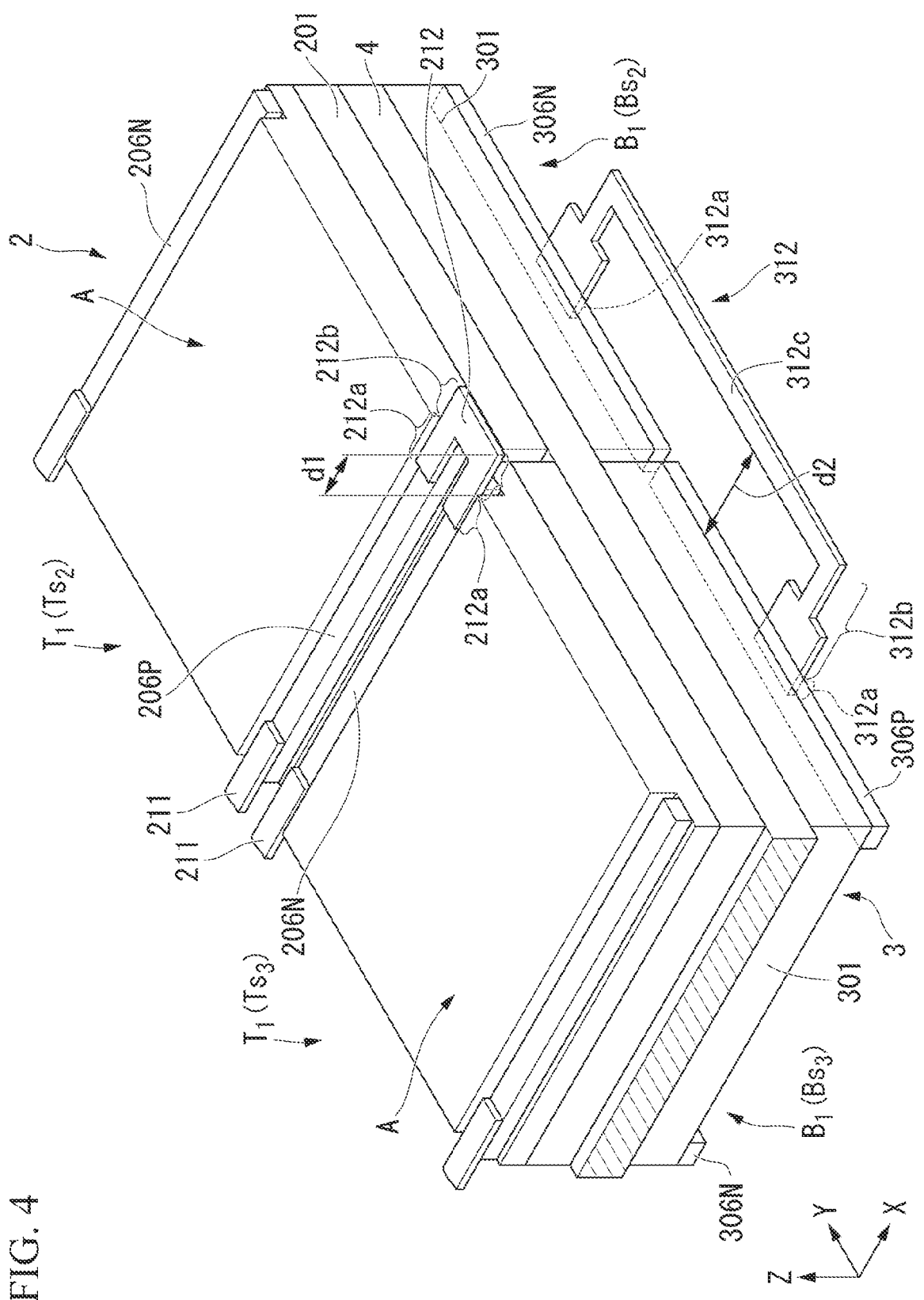
FIG. 4 is a perspective view of the F4 portion in FIG. 1.

FIG. 1 is a plan view showing an example of the tandem solar cell of the first embodiment. FIG. 2 is a cross-sectional view taken along line F2-F2 in FIG. 1. FIG. 3 is a perspective view of the F3 portion in FIG. 1. FIG. 4 is a perspective view of the F4 portion in FIG. 1.

The tandem solar cell 1 shown in FIG. 1 generates electricity by photoelectrically converting incident light incident from the front side to the back side of the paper. Hereinafter, viewing the tandem solar cell 1 along the normal line of the incident surface of the incident light in the tandem solar cell 1 is referred to as planar view. In this embodiment, the plan view is the same as the view from the thickness direction of the top cell Ti, which will be described later.

As shown in FIG. 2, the tandem solar cell 1 includes a top cell module 2 and a bottom cell module 3. The top cell module 2 and the bottom cell module 3 are mechanically joined together in the thickness direction with an insulating layer 4 having optical transparency interposed therebetween, and the top cell module 2 and the bottom cell module 3 are electrically separated from each other. For example, the insulating layer 4 is formed by applying a transparent resin adhesive to the surface of a transparent base material.

As shown in FIG. 1, the top cell module 2 has m (where m is an integer equal to or greater than 2) top cell strings Ts1, . . . , Tsm. Each of the top cell strings Ts1, . . . , Tsm is configured by electrically connecting n (where n is an integer equal to or greater than 2) top cells T1, . . . , Tn to each other.

Hereinafter, any one of the top cells T1, . . . , Tn may be referred to as "top cell Ti", where i represents any one of 1 to n. Any one of the top cell strings Ts1, . . . , Tsm may be referred to as "top cell string Tsj", where j represents any one of 1 to m.

The entire of the top cells T1, . . . , Tn may be referred to as "top cell T1-Tn", and the entire of the top cell strings Ts1, . . . , Tsm may be referred to as "top cell string Ts1-Tsm".

It is more preferable that the rated outputs of the top cells T1-Tn constituting the top cell string Tsj are the same, but they do not have to be the same. Here, the rated output is the amount of power generated by the top cell when AM1.5 sunlight (1 kW/m2) is vertically incident, that is, the product of the output voltage and the output current.

In the following, for the sake of simplicity, an example in which the rated outputs of the top cells T1-Tn in the top cell string Tsj are the same will be described.

In the top cell strings Ts1-Tsm, if the suffix j is different, the rated outputs of the top cells Ti with the same suffix i may be the same or may not be the same. In the following, for simplicity, an example will be described in which the top cells Ti in the top cell strings Tsj with different subscripts j have the same rated output.

That is, in the following description, the rated output of each top cell Ti and the rated output of each top cell string Tsj are the same.

In the example shown in FIG. 1, in the top cell module 2, n top cells Ti are arranged in the horizontal direction of the figure and electrically connected to each other to form a top cell string Tsj. The top cell strings Tsj are arranged adjacent to each other in their respective longitudinal directions (horizontal direction in the drawing). Therefore, the top cells Ti in the top cell module 2 are arranged in an n×m rectangular grid as a whole. Although an example of n=6 and m=4 is shown in FIG. 1, n and m are not limited to this.

Hereinafter, the longitudinal direction of each top cell string Tsj is referred to as the X-axis direction, and the arrangement direction (vertical direction in the figure) of each top cell string Tsj is referred to as the Y-axis direction. The thickness direction of the tandem solar cell 1 is called the Z-axis direction.

The positive direction of the X-axis direction (X-axis positive direction) is the direction in which the subscript i of the top cell Ti is arranged in descending order. The Y-axis positive direction (Y-axis positive direction) is the direction in which subscripts j of the top cell strings Tsj are arranged in descending order. The positive direction of the Z-axis direction (positive Z-axis direction) is the direction from the bottom cell module 3 toward the top cell module 2 in the normal direction of the incident surface of the top cell module 2. The X-axis negative direction, the Y-axis negative direction, and the Z-axis negative direction are directions opposite to the X-axis positive direction, the Y-axis positive direction, and the Z-axis positive direction, respectively.

The Z-axis direction is a vertical direction with the Z-axis positive direction upward and the Z-axis negative direction downward. Hereinafter, unless otherwise specified, up and down mean up and down in the Z-axis direction.

Since each top cell Ti has the same configuration in the top cell module 2 shown in FIG. 1, the top cell T2 of the top cell string Ts1 shown in FIG. 2 will be mainly described as an example.

The top cell T2 includes a substrate 201 and a serial array cell A.

The substrate 201 is a plate member forming the lower layer of the top cell T2. The material of the substrate 201 is not particularly limited as long as it has optical transparency. A higher transmittance of the substrate 201 is more preferable. For example, the material of substrate 201 is more preferably glass. For example, as the material of the substrate 201, acrylic, polyimide, polycarbonate, polyethylene terephthalate (PET), polypropylene (PP), fluorine resin (polytetrafluoroethylene (PTFE), perfluoroethylene propene copolymer (FEP), ethylenetetrafluoroethylene copolymer (ETFE), polychlorotrifluoroethylene (PCTFE), perfluoroalkoxyalkane (PFA), etc.), transparent resins such as polyarylate, polysulfone, polyethersulfone and polyetherimide, soda lime glass, white plate glass, inorganic materials such as chemically strengthened glass and quartz can be used. The substrate 201 may be laminated with the materials listed above.

The substrate 201 is mechanically joined to the surface of the insulating layer 4 in the positive direction of the Z-axis in a posture in which the plate thickness direction coincides with the Z-axis direction.

The substrate 201 defines the connecting portion of the top cell T2 in the plan view. The outside of the top cell T2 in the plan view refers to a region outside the outer peripheral portion of the substrate 201 in the plan view.

As shown in the example of the top cell T1 in the top cell string Ts1 in FIG. 3, the planar shape of the substrate 201 is a rectangle having two sides extending in the X-axis direction and two sides extending in the Y-axis direction.

As shown in FIG. 2, the serial array cell A is a solar cell that has light transmittance in the thickness direction. The serial array cell A is stacked on the surface 201a of the substrate 201 opposite to the insulating layer 4 (positive direction of the Z-axis).

The serial array cell A has a negative electrode portion A0, k (k is an integer equal to or greater than 2) unit cells A1, ..., Ak, and a positive electrode portion Ak+1. The number k of the unit cells A1, ..., Ak is not particularly limited as long as it is 2 or more. For example, k may be 25.

The unit cells A1, ..., Ak absorb part of the incident light L that enters from above the top cell module 2 and generate power. In FIG. 2, the incident light L is depicted as vertically incident on the top cell module 2, but the incident angle of the incident light L is not limited to being vertical.

The unit cells A1, ..., Ak are connected in series between the negative electrode portion A0 and the positive electrode portion Ak+1.

The negative electrode portion A0, the unit cells A1, ..., Ak, and the positive electrode portion Ak+1 have a strip shape extending in the X-axis direction over the entire width of the substrate 201 in the X-axis direction.

The negative electrode portion A0, the unit cells A1, ..., Ak, and the positive electrode portion Ak+1 are arranged in this order from the end of the substrate 201 in the Y-axis positive direction toward the end in the Y-axis negative direction in the plan view.

The lower layer portion of the series array cell A laminated on the surface 201a is formed by the back transparent electrode layer 202.

The back transparent electrode layer 202 is formed of a conductive film having optical transparency. For example, the back transparent electrode layer 202 preferably includes one or more layers of oxide transparent conductive films.

The type of oxide transparent conductive film is not particularly limited. For example, the oxide transparent conductive film may be a semiconductor conductive film such as, Indium Tin Oxide (ITO), Aluminum-doped Zinc Oxide (AZO), Boron-doped Zinc Oxide (BZO), Gallium-doped Zinc Oxide (GZO), doped tin oxide, Titanium-doped Indium Oxide (ITiO), Indium Zinc Oxide (IZO) and Indium Gallium Zinc Oxide (IZO), Gallium Zinc Oxide (IGZO), and Hydrogen-doped Indium Oxide (IOH).

For example, the oxide transparent conductive film may be a laminated film having a plurality of films.

The dopant for the film such as tin oxide is not particularly limited. For example, dopants include one or more elements selected from the group consisting of In, Si, Ge, Ti, Cu, Sb, Nb, Ta, W, Mo, F, and Cl.

Preferably, the back transparent electrode layer 202 includes a tin oxide film doped with one or more elements selected from the group consisting of In, Si, Ge, Ti, Cu, Sb, Nb, Ta, W, Mo, F, and Cl. Preferably, in the doped tin oxide film, the one or more elements selected from the group consisting of In, Si, Ge, Ti, Cu, Sb, Nb, Ta, W, Mo, F, and Cl are contained in an amount of 10 atomic % or less with respect to tin contained in the tin oxide film.

Preferably, the back transparent electrode layer 202 includes a dot-like, line-like or mesh-like electrode between the oxide transparent conductive film and the substrate 201 or between the oxide transparent conductive film and the p-Cu$_2$O layer 203 described later. Preferably, the dot-shaped, line-shaped or mesh-shaped electrode contain one or more materials selected from the group consisting of metals, alloys, graphene, conductive nitrides, and conductive oxides.

The dot-shaped, line-shaped, or mesh-shaped electrode is effective when the electrical resistance of the oxide transparent conductive film is high and the efficiency is lowered due to a voltage drop if the electrode is used alone.

Preferably, the metal used for the dot-shaped, line-shaped, or mesh-shaped electrode preferably has an aperture ratio of 95% or more with respect to the oxide transparent conductive film.

The metal used for the dot-shaped, line-shaped, or mesh-shaped electrodes is not particularly limited, but Mo, Au, Cu, Ag, Al, Ta, W, etc. are exemplified.

When a line-shaped or mesh-shaped metal film is used as an electrode, the film thickness of the metal film is not particularly limited as long as the required light transmittance is ensured by the openings and the electrical resistance is lower than that of the oxide transparent conductive film.

The back transparent electrode layer 202 is patterned in each shape of the negative electrode portion A0 and the unit cells A1, ..., Ak in the plan view. Therefore, the back transparent electrode layer 202 forms (k+1) strip-shaped conductive patterns separated from each other in the Y-axis direction.

The back transparent electrode layer 202 forming the lower layer portion of the unit cell Ak protrudes in the Y-axis negative direction from the upper layer portion of the unit cell Ak in the plan view. A positive electrode portion Ak+1 is formed on the rear transparent electrode layer 202 that protrudes in the Y-axis negative direction from the upper layer portion of the unit cell Ak.

The negative electrode portion A0 has a negative electrode 206N laminated on the back transparent electrode layer 202 forming the lower layer portion of the negative electrode portion A0. The negative electrode 206N is arranged to cover the entire rear transparent electrode layer 202 forming the lower layer of the negative electrode portion A0 and is electrically connected to the rear transparent electrode layer 202.

The negative electrode 206N is made of a conductive material such as a metal film. The material of the metal film is not particularly limited.

For example, the negative electrode 206N may be formed of a conductive film similar to a surface transparent electrode layer 205, which will be described later. For example, Mo, Au, Cu, Ag, Al, Ta, W, etc. are exemplified as a material of the metal film used for the negative electrode 206N. It is also preferable to use a conductive metal paste as the metal film.

Each of the unit cells A1, ..., Ak is, for example, a cuprous oxide (Cu$_2$O) solar cell. Each of the unit cells A1, ..., Ak has the back transparent electrode layer 202, the p-Cu$_2$O layer 203, the n-compound layer 204, and the front transparent electrode layer 205 laminated in this order on the surface 201a. However, such a configuration is an example.

The unit cell A1, ..., Ak may have any configuration as long as it can generate electric power by photoelectrically converting the incident light L and transmit part of the incident light L downward. For example, in the unit cell A1, ..., Ak, in addition to the layer structure described above, a protective film, a sealing material, and the like may be added as appropriate. For example, an antireflection film may be formed on the upper surface of the n-compound layer 204 for the purpose of increasing the amount of incident light L incident on the p-Cu$_2$O layer 203 and the n-compound layer 204, which are power generation layers.

The types of unit cells A1, ..., Ak are not limited to cuprous oxide solar cells. For example, the type of unit cell A1, ..., Ak may be a dye-sensitized solar cell, an organic thin-film solar cell, a perovskite solar cell, or the like.

The p-Cu$_2$O layer 203 is a p-type semiconductor that generates holes and electrons by incident light L and is formed of a thin film of p-type cuprous oxide.

The n-compound layer 204 is an n-type semiconductor that transports electrons generated in the p-Cu$_2$O layer 203 by the incident light L to the surface transparent electrode layer 205 and is laminated on the upper surface of the p-Cu$_2$O layer 203. The n-compound layer 204 forms a hetero pn junction with the p-Cu$_2$O layer 203.

Although the n-compound layer 204 is not particularly limited, it is preferably an oxide semiconductor layer containing Ga and containing a compound containing Ga as a main component. For example, the n-compound layer 204 may be a Ga-based oxide mixed with other oxides, may be an oxide mainly composed of Ga doped with other elements, or may be a mixture of a Ga-based oxide doped with another element and another oxide.

The n-compound layer 204 is a single layer or multiple layers. Among the metal elements contained in the n-compound layer 204, Ga is preferably 50 atomic % or more.

The metal element contained in the n-compound layer 204 may be inclined from the p-Cu$_2$O layer 203 side toward the surface transparent electrode layer 205 side.

Preferably, the n-compound layer 204 contains 90 wt % or more of an oxide of one or more elements selected from the group consisting of Sn, Sb, Ag, Li, Na, K, Cs, Rb, Al, In, Zn, Mg, Si, Ge, N, B, Ti, Hf, Zr, and Ca and an oxide of Ga.

The surface transparent electrode layer 205 is laminated on the upper surface of the n-compound layer 204. Like the back transparent electrode layer 202, the front transparent electrode layer 205 is made of a conductive film having optical transparency. For example, the front transparent electrode layer 205 may be made of the same material as the back transparent electrode layer 202.

With such a configuration, the unit cells A1, . . . , Ak constitute a solar cell having the back transparent electrode layer 202 as a positive electrode and the front transparent electrode layer 205 as a negative electrode.

Adjacent unit cells in the Y-axis direction among the unit cells A1, . . . , Ak are connected in series with conductive paths 208 interposed therebetween.

As the conductive path 208, an appropriate conductor that can electrically connect the back transparent electrode layer 202 and the front transparent electrode layer 205 is used. In FIG. 2, each conductive path 208 is schematically drawn as a line but is not limited to a linear wiring. For example, each conductive path 208 is formed by forming the n-compound layer 204 on the p-Cu$_2$O layer and then performing groove processing to expose the back transparent electrode layer 202 at that location, and then forming the front transparent electrode layer 205. Thus, the rear transparent electrode layer 202 and the front transparent electrode layer 205 may be electrically connected through the groove.

The surface transparent electrode layer 205 in the unit cell A1 is electrically connected to the negative electrode 206N of the negative electrode portion A0 through a conductive path 208.

The positive electrode portion Ak+1 has a positive electrode 206P on the back transparent electrode layer 202 forming the lower layer portion of the unit cell Ak. The positive electrode 206P is laminated on the rear transparent electrode layer 202 forming the lower layer portion of the unit cell Ak, extends in the X-axis direction, and is electrically connected to the rear transparent electrode layer 202.

In the serial array cell A, the upper surface of each surface transparent electrode layer 205 of the unit cell A1, . . . , Ak and the upper surfaces of the negative electrode 206N and the positive electrode 206P are the upper surface of the series array cell A and constitute the surface of the top cell T2.

In particular, the upper surface of each surface transparent electrode layer 205 of the unit cell A1, . . . , Ak is positioned substantially on the same plane as the plane Is having a normal extending in the Z-axis direction.

In FIG. 2, the top surfaces of the negative electrode 206N and the positive electrode 206P are drawn lower than the plane Is, but the height of each top surface is not limited to this. For example, one or both of the upper surface of the negative electrode 206N and the upper surface of the positive electrode 206P may be positioned at a height equal to or higher than the plane Is.

The negative electrode 206N and the positive electrode 206P in each top cell Ti are provided on the surface side where the incident light L is incident. The negative electrode 206N and the positive electrode 206P in each top cell Ti are examples of first cell electrodes provided on the surface opposite to the surface facing each bottom cell Bi.

Each top cell Ti in the top cell module 2 has the same configuration as the top cell T2 described above.

As shown in FIG. 1, the top cells Ti are arranged in a rectangular lattice in the X-axis direction and the Y-axis direction, with the negative electrode 206N positioned in the Y-axis positive direction and the positive electrode 206P positioned in the Y-axis negative direction. Note that the detailed structure of the serial array cell A is omitted in FIG. 1 for the sake of simplicity.

In each top cell string Tsj, top cells Ti adjacent to each other in the X-axis direction are electrically connected by first cell connects 211, respectively. The first cell connect 211 is a conductor that electrically connects the negative electrodes 206N or the positive electrodes 206P.

The configuration of the first cell connect 211 is not particularly limited as long as the negative electrodes 206N and the positive electrodes 206P can be electrically connected to each other. In the example shown in FIG. 3, the first cell connect 211 is a ribbon-shaped conductor having a width shorter than the length of the negative electrode 206N and the positive electrode 206P and equal to or less than the lateral width (the width in the Y-axis direction).

It should be noted that in FIG. 3, for the sake of simplicity, the illustration of the detailed structure of the serial array cell A is omitted.

The first cell connect 211 is arranged across the upper side of the negative electrodes 206N that are adjacent to each other in the X-axis direction, and is joined to each negative electrode 206N by, for example, a conductive paste or a solder material. In FIG. 1, the first cell connect 211 is an example of a short connect that connects adjacent top cells, but the shape of the first cell connect 211 is not limited to this. For example, as the first cell connect 211, a single long cell connect that is connected to each negative electrode 206N over the entire plurality of cells forming one string may be used.

Similarly, the first cell connect 211 is arranged across the upper side of the positive electrodes 206P that are adjacent to each other in the X-axis direction, and is joined to each positive electrode 206P by, for example, a conductive paste or a solder material. Like the first cell connect 211 that connects the negative electrodes 206N, the first cell connect 211 that connects the positive electrodes 206P is connected to each positive electrode 206P across the entire plurality of cells that constitute one string. A single long cell connect may be used.

Each negative electrode 206N and each positive electrode 206P of each top cell string Tsj electrically connected by the first cell connect 211 are provided on the surface side where the incident light L is incident. Each negative electrode 206N and each positive electrode 206P of each top cell string Tsj electrically connected by the first cell connect 211 are examples of a first electrode portion provided on the side opposite to the side facing each bottom cell string Bsj, which will be described later.

As shown in FIG. 1, the positive electrode 206P and the negative electrode 206N at the ends (top cells Tn) of the top cell strings Ts1 and Ts2 in the negative direction of the X axis are electrically connected to each other by a first string connection 212.

The positive electrode 206P and the negative electrode 206N at the end (top cell Ti) of the top cell strings Ts2 and Ts3 in the positive direction of the X axis are electrically connected to each other by the first string connection 212.

The first string connection 212 electrically connects the positive electrode 206P and the negative electrode 206N at the ends (top cells Tn) of the top cell strings Ts3 and Ts4 in the negative direction of the X axis.

For this reason, the first string connection 212 electrically connects the top cell strings Tsj, which are different from each other in the plan view, of the top cell strings Tsj at the respective first electrode portions.

The configuration of each first string connection 212 is not particularly limited as long as it can electrically connect the positive electrode 206P and the negative electrode 206N.

In the example shown in FIG. 1, each first string connection 212 has the same shape. Each first string connection 212 is formed in a U shape opening in the Y-axis direction in a plan view, and is a ribbon-shaped conductor having a width equal to or smaller than the lateral width of the negative electrode 206N and the positive electrode 206P.

As shown in FIG. 4, the first string connection 212 includes a connecting portion 212a that connects to the positive electrode 206P and the negative electrode 206N from above, and a first extending portion 212b that extends outside the top cell module 2 in the plan view.

Each connecting portion 212a is arranged above the positive electrode 206P and the negative electrode 206N that are adjacent to each other in the Y-axis direction. Each connecting portion 212a is joined to the positive electrode 206P and the negative electrode 206N by, for example, a conductive paste or a solder material.

The first extending portion 212b extends from each connecting portion 212a in the positive direction of the X-axis, and along a path that bends or curves in a U-shape in the plan view, extends outside the connecting portion of each top cell T1 defined by the connecting portion of the substrate 201.

The extension length in the X-axis direction of the first extending portion 212b is, for example, d1.

In the example shown in FIG. 4, each connecting portion 212a and the first extending portion 212b of the first string connection 212 are formed of a single member that is U-shaped in the plan view, but the configuration of the first string connection 212 is not.

The first string connection 212 may be configured by joining a plurality of conductors together. For example, the first string connection 212 may have a first conductor similar to the first cell connect 211 and a second conductor joining the first conductors.

Each first conductor is joined to the upper side of the positive electrode 206P and the negative electrode 206N.

As the second conductor, a ribbon-shaped conductor that joins the first conductors in the Y-axis direction, a conductor having a U-shape in plan view similar to the first extending portion 212b and having a U-shaped tip joined onto each of the first conductors, or the like can be used.

In this case, the first string connection 212 has a U-shape in the plan view in which each first conductor and second conductor are joined. Each first conductor on positive electrode 206P and negative electrode 206N form a connection similar to connection 212a. Each first conductor and second conductor located outside the connecting portion of each top cell Ti form a first extending portion similar to the first extending portion 212b.

As shown in FIG. 1, a first negative electrode terminal 210N is connected from above to the end of the negative electrode 206N of the top cell string Ts1 in the positive direction of the X axis.

The configuration of the first negative electrode terminal 210N is not particularly limited as long as it can be electrically connected to the negative electrode 206N and can be connected to external wiring for extracting the output of the positive electrode of the top cell module 2 to the outside.

In the example shown in FIG. 3, the first negative terminal 210N includes a connecting portion 210a connected to the negative electrode 206N from above and a third extending portion 210b extending outside the top cell module 2 in the plan view.

The connecting portion 210a has a width equal to or less than the lateral width of the negative electrode 206N in the Y-axis direction, and a width less than the longitudinal width of the negative electrode 206N in the X-axis direction.

In FIG. 3, a terminal electrode 210c having a width wider than that of the connecting portion 210a is drawn for the purpose of connecting an external wiring at the tip of the third extending portion 210b in the extending direction. However, if the connection with the external wiring can be reliably performed, the terminal electrode 210c and the connecting portion 210a may have the same width in the Y-axis direction.

For example, the first negative terminal 210N may be formed of a conductor such as a ribbon-shaped metal wire made of the same material as the first cell connect 211.

As shown in FIG. 1, a first positive electrode terminal 210P is connected from above to the end of the positive electrode 206P of the top cell string Ts4 in the positive direction of the X axis.

The configuration of the first positive electrode terminal 210P is not particularly limited as long as it can be electrically connected to the positive electrode 206P and can be connected to external wiring for extracting the output of the negative electrode of the top cell module 2 to the outside.

Like the first negative terminal 210N, the first positive terminal 210P includes a connecting portion 210a connected to the positive electrode 206P from above, and a third extending portion 210b extending outside the top cell module 2 in the plan view. The connecting portion 210a of the first positive electrode terminal 210P has a width equal to or less than the lateral width of the positive electrode 206P.

In FIG. 1, a terminal electrode 210c similar to that of the first negative terminal 210N is drawn at the tip of the third extending portion 210b of the first positive terminal 210P in the extending direction. However, if the connection with the external wiring can be ensured, the terminal electrode 210c and the connecting portion 210a may have the same width in the Y-axis direction.

For example, the first positive terminal 210P may be formed of a conductor such as a ribbon-shaped metal wire made of the same material as the first cell connect 211, like the first negative terminal 210N.

An equivalent circuit of the top cell module 2 described above will be described.

Figure 5:
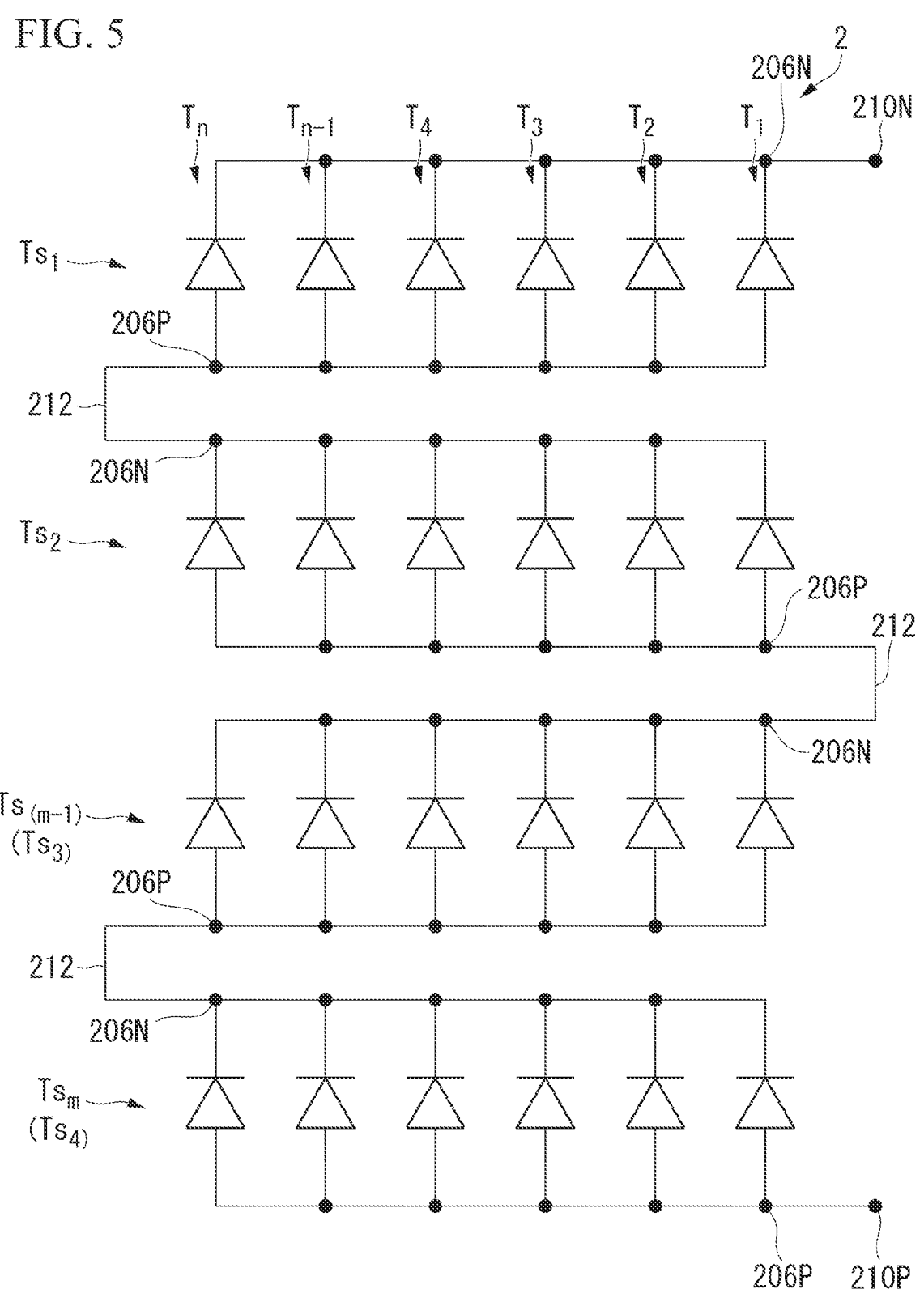
FIG. 5 is an equivalent circuit diagram of a top cell module in the tandem solar cell of the first embodiment.

FIG. 5 is an equivalent circuit diagram of the top cell module in the tandem solar cell of the first embodiment.

As shown in FIGS. 4 and 5, the top cells T1-Tn in each top cell string Tsj are connected in parallel by the first cell connect 211.

The top cell strings Ts1-Tsm are connected in series by the first string connection 212.

The top cell module 2 has a circuit configuration (n parallel m series) in which m sets of n top cells Ti connected in parallel are connected in series.

Each negative electrode 206N in the top cell string Ts1 is the positive electrode of the top cell module 2. Each positive electrode 206P in top cell string Tsm is the negative electrode of top cell module 2.

Among the positive electrodes of the top cell module 2, the first negative electrode terminal 210N is connected to the negative electrode 206N of the top cell T1.

Among the negative electrodes of the top cell module 2, the first positive electrode terminal 210P is connected to the positive electrode 206P of the top cell T1.

When each top cell string Tsj of the top cell module 2 generates power due to incident light L entering the top cell module 2, a voltage is generated between the first negative terminal 210N and the first positive terminal 210P. When an external load is connected to the first negative terminal 210N and the first positive terminal 210P, power generation output can be extracted from the first negative terminal 210N and the first positive terminal 210P.

Next, the configuration of the bottom cell module 3 will be described.

Figure 6:
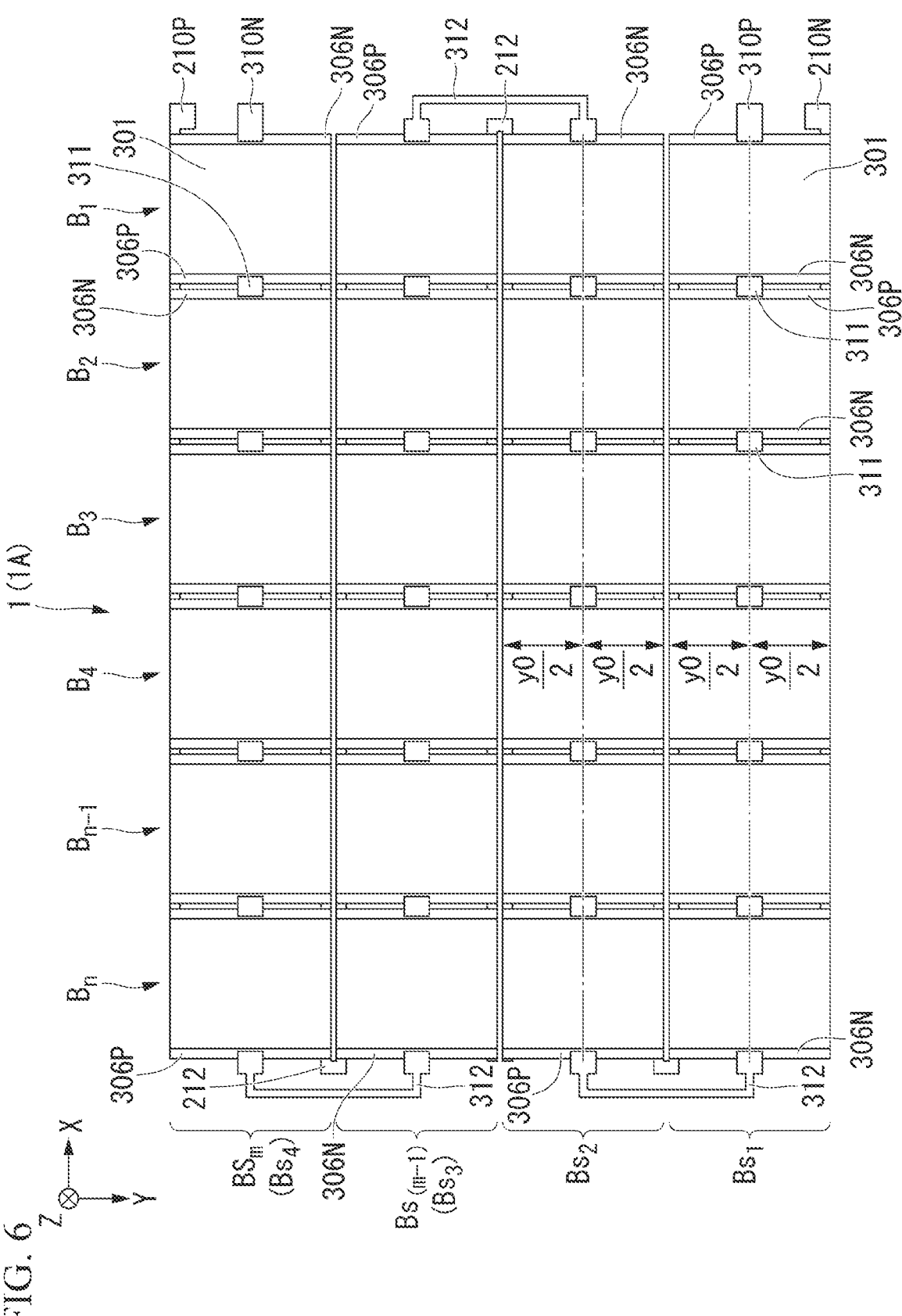
FIG. 6 is a back view showing an example of the tandem solar cell of the first embodiment.
Figure 7:
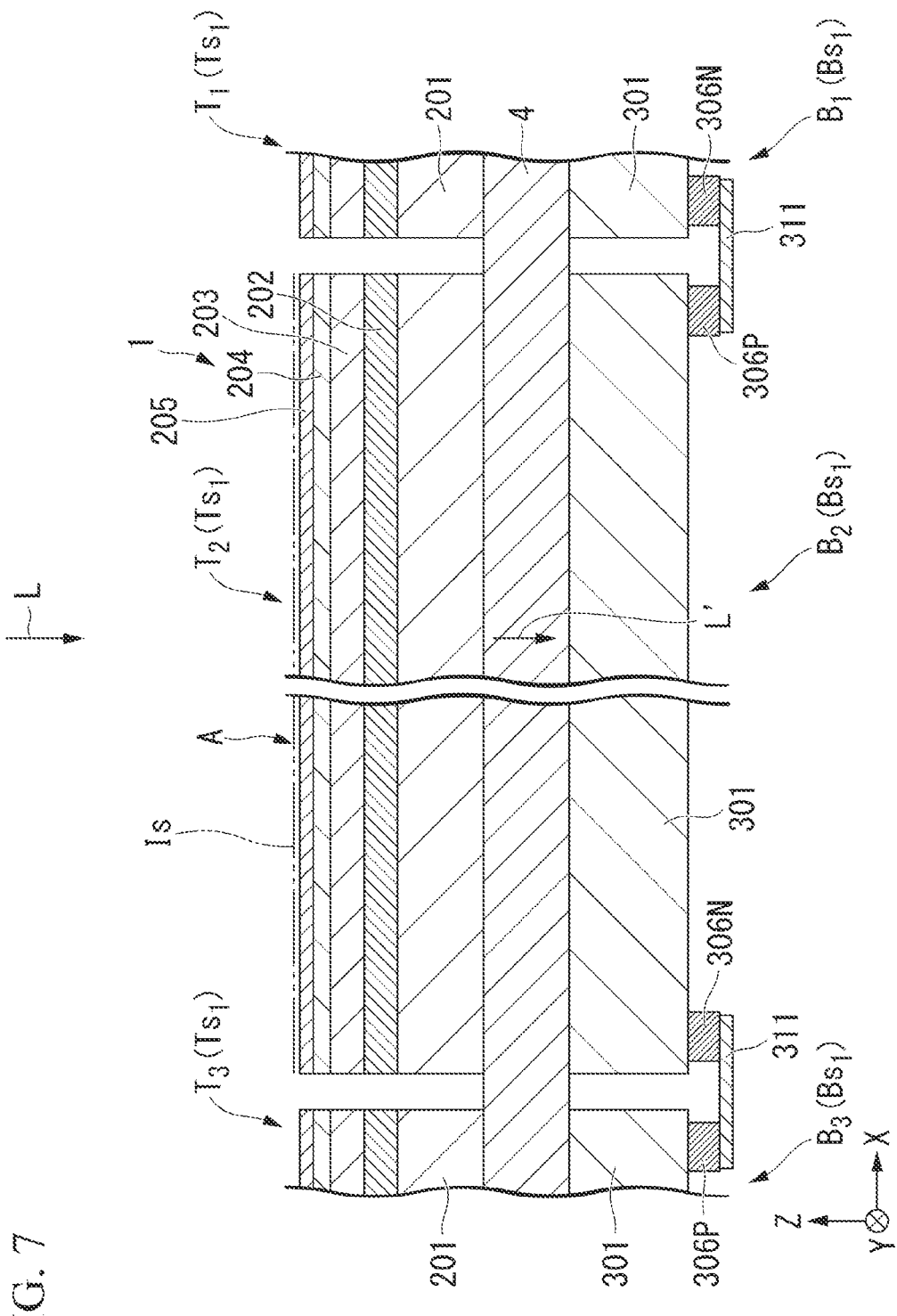
FIG. 7 is a sectional view along line F7-F7 in FIG. 1.

FIG. 6 is a back view showing an example of the tandem solar cell of the first embodiment. FIG. 7 is a cross-sectional view taken along line F7-F7 in FIG. 1.

As shown in FIG. 6, the bottom cell module 3 has m (where m is an integer equal to or greater than 2) bottom cell strings Bs1, . . . , Bsm. Each of the bottom cell strings Bs1, . . . , Bsm is configured by electrically connecting n (where n is an integer equal to or greater than 2) bottom cells B1, . . . , Bn to each other.

Here, the numbers n and m in the bottom cell module 3 may be different from the numbers n and m in the top cell module 2. However, in the following, an example in which the numbers n and m in the top cell module 2 are equal will be described.

In the following, when referring any one of the bottom cells B1, . . . , Bn, it may be described as "bottom cell Bi" where i represents any one of 1 to n. When referring to any one of the bottom cell strings Bs1, . . . , Bsm, it may be described as "bottom cell string Bsj" where j represents any one of 1 to m.

The entire of the bottom cell B1, . . . , Bn may be described as "bottom cell B1-Bn", and the entire of the bottom cell string Bs1, Bsm may be described as "bottom cell string Bs1-Bsm".

The rated outputs of the bottom cells B1-Bn forming bottom cell string Bsj are more preferably the same, but they do not have to be the same. For simplicity, an example will be described below in which the bottom cells B1 to Bn in one bottom cell string Bsj have the same rated output.

In the bottom cell strings Bs1-Bsm, when j is different, the rated outputs of the bottom cells Bi with the same subscript i included therein may or may not be the same. In the following, for simplicity, an example will be described in which the bottom cell strings Bsj with different suffixes j have the same rated output of each bottom cell Bi.

That is, in the following description, the rated output of each bottom cell Bi and the rated output of each bottom cell string Bsj are the same.

In the example shown in FIG. 7, each bottom cell Bi in the bottom cell module 3 has the same external shape and external size in the plan view as the external shape and external size of each top cell Ti. Each bottom cell Bi overlaps the top cell Ti corresponding to the subscript i in the plan view. Therefore, the bottom cell string Bsj and the top cell string Tsj having the same subscript j overlap each other in the thickness direction. When overlapping, the top cell string Tsj and the bottom cell string Bsj do not have to completely overlap.

The outer shape and outer size of the bottom cell Bi may be different from those of the top cell Ti. The bottom cell Bi and the top cell Ti may be shifted in at least one of the X-axis direction and the Y-axis direction.

Since each bottom cell Bi in the bottom cell module 3 has the same configuration, an example of the bottom cell B2 of the bottom cell string Bs1 shown in FIG. 7 will be mainly described.

The bottom cell B2 is a solar cell that generates power by receiving the incident light L' that has passed through the top cell T2 and the insulating layer 4 out of the incident light L. The type of the bottom cell B2 is not particularly limited as long as it can generate power with light of a wavelength that is difficult to be absorbed by the top cell T2.

For example, since long-wavelength light can easily reach the deep part of the medium, it is more preferable that the top cell T2 can generate power with the short-wavelength component and the bottom cell B2 can generate power with the long-wavelength component. For example, a cuprous oxide solar cell is suitable for the top cell T2 because it absorbs short-wavelength light and easily transmits long-wavelength light. When the top cell T2 is a cuprous oxide solar cell, it is more preferable that the bottom cell B2 is a solar cell having a spectral sensitivity in the long wavelength side from about 600 nm through which the cuprous oxide solar cell is easily transmitted.

The bottom cell B2 is, for example, a back-contact solar cell. In this case, the bottom cell B2 has a cell body 301, a positive electrode 306P and a negative electrode 306N.

Figure 8A:
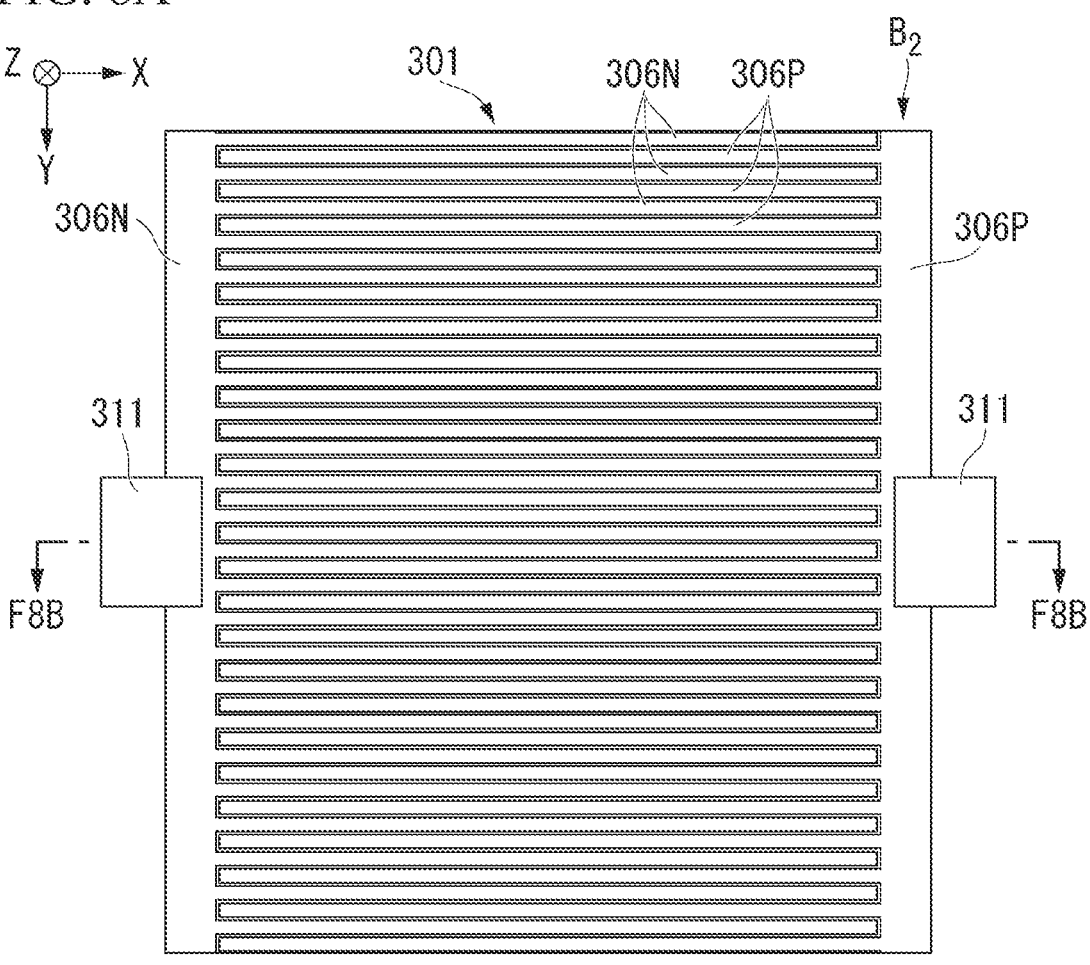
FIG. 8A is a back view showing an example of a back-contact solar cell used in the tandem solar cell of the first embodiment.
Figure 8B:
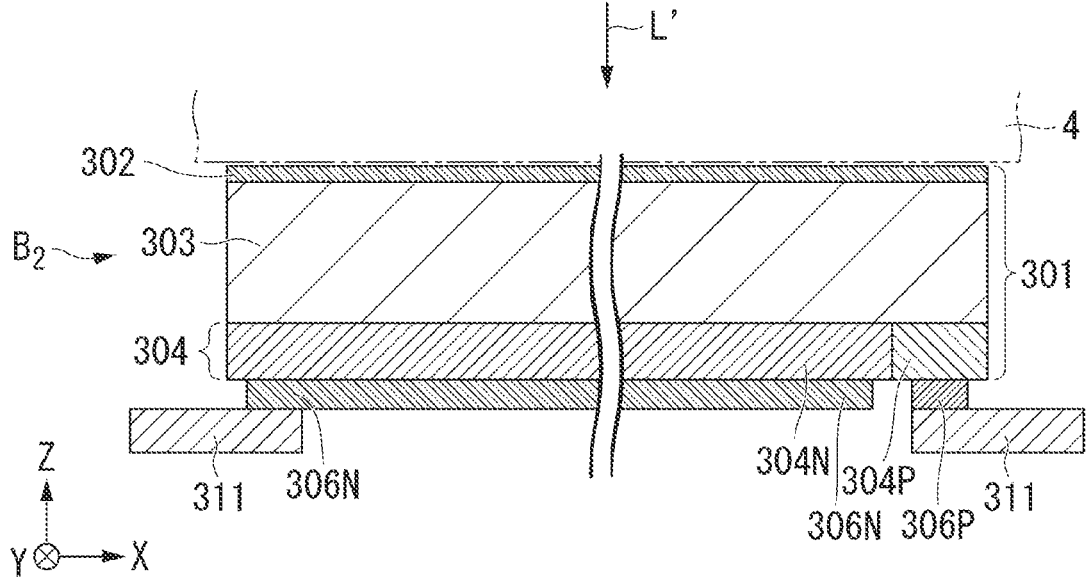
FIG. 8B is a cross-sectional view along line F8B-F8B in FIG. 8A.

FIG. 8A is a back view showing an example of a back-contact solar cell. FIG. 8B is a cross-sectional view along line F8B-F8B in FIG. 8A.

The arrangement of the cell bodies 301 shown in FIG. 8A is an example when used for the bottom cell B2 of the bottom cell string Bs1. The line F8B-F8B in FIG. 8A corresponds to the line F7-F7 in FIG. 1.

As shown in FIG. 8B, the cell body 301 has an antireflection film 302, an n-type semiconductor 303, and a diffusion layer 304 laminated in this order in the Z-axis negative direction. The configuration shown in FIG. 8B is an example. For example, a protective film, a sealing material, or the like may be added to the cell body 301 as appropriate.

The antireflection film 302 is bonded to the bottom surface of the insulating layer 4. The antireflection film 302 is provided on the upper surface of the cell body 301 to suppress reflection of the incident light U transmitted through the top cell module 2 and the insulating layer 4.

The n-type semiconductor 303 receives the incident light L' and generates carriers. For example, the n-type semiconductor 303 is an n-type crystalline Si substrate.

In the diffusion layer 304, p+ diffusion layers 304P and n+ diffusion layers 304N are alternately arranged in the Y-axis direction. The end of each p+ diffusion layer 304P in the X-axis positive direction is connected to the p+ diffusion layer 304P extending in the Y-axis direction. The end of each n+ diffusion layer 304N in the negative direction of the X-axis is connected to the n+ diffusion layer 304N extending in the Y-axis direction. Thus, in the diffusion layer 304, the p+ diffusion layer 304P and the n+ diffusion layer 304N, which are pectinate in the plan view, are fitted together to form a rectangular layered portion in the plan view.

Of the carriers generated in the n-type semiconductor 303, holes are attracted to the p+ diffusion layer 304P and electrons are attracted to the n+ diffusion layer 304N, so that a voltage is generated between the p+ diffusion layer 304P and the n+ diffusion layer 304N.

A positive electrode 306P is joined to the lower surface of each p+ diffusion layer 304P. A negative electrode 306N is joined to the lower surface of each n+ diffusion layer 304N.

As shown in FIG. 8A, the positive electrode 306P viewed from the Z-axis positive direction forms a comb-like conductive pattern similar to the p+ diffusion layer 304P. The positive electrode 306P is used as a positive electrode for taking out the positive voltage generated in the cell body 301.

The end portion of the positive electrode 306P in the positive direction of the X-axis is a strip-shaped conductive portion that is long in the Y-axis direction. The end of the positive electrode 306P in the positive direction of the X axis is used for electrical connection with the bottom cell B1.

The negative electrode 306N viewed from the Z-axis positive direction forms a comb-shaped conductive pattern similar to the n+ diffusion layer 304N. The comb teeth of the negative electrode 306N enter the recesses of the comb teeth of the positive electrode 306P.

The negative electrode 306N is used as a negative electrode for taking out the negative voltage generated in the cell body 301.

The end of the negative electrode 306N in the negative direction of the X-axis is a strip-shaped conductive portion that is long in the Y-axis direction. The end of the negative electrode 306N in the negative direction of the X axis is used for electrical connection with the bottom cell B3.

A gap exists between the negative electrode 306N and the positive electrode 306P when viewed from the Z-axis positive direction, and they are not in direct contact.

As shown in FIG. 8B, the positive electrode 306P and the negative electrode 306N are provided on the back side of the cell body 301 of the bottom cell B2, opposite to the front side on which the incident light U is incident. The positive electrode 306P and the negative electrode 306N are examples of second cell electrodes provided on the surface opposite to the surface facing each top cell Ti.

For example, in FIGS. 6 and 7, which are schematically shown, representative of the second cell electrode of the bottom cell Bi, a positive electrode 306P that is long in the Y-axis direction at the end in the X-axis direction and a negative electrode 306N that is long in the Y-axis direction at the end in the X-axis direction are described.

Hereinafter, unless otherwise specified, the positive electrode 306P and the negative electrode 306N respectively mean the portion of the positive electrode 306P and the portion of the negative electrode 306N extending in the Y-axis direction at the ends in the X-axis direction.

The cell body 301 defines the outer shape of the bottom cell B2 in the plan view. The outside of the bottom cell B2 in the plan view refers to a region outside the outer peripheral portion of the cell body 301 in the plan view.

As shown in the example of the bottom cell B1 in the bottom cell string Bs1 in FIG. 3, the planar shape of the cell body 301 is a rectangle having two sides extending in the X-axis direction and two sides extending in the Y-axis direction.

Each bottom cell Bi in the bottom cell module 3 has the same configuration as the bottom cell B2 described above.

As shown in FIG. 6, in the bottom cell strings Bs1 and Bs3, each bottom cell Bi is arranged side by side in the X-axis direction with the positive electrode 306P positioned in the X-axis positive direction and the negative electrode 306N positioned in the X-axis negative direction.

In the bottom cell strings Bs2 and Bs4, the bottom cells Bi are arranged side by side in the X-axis direction with the positive electrode 306P located in the X-axis negative direction and the negative electrode 306N located in the X-axis positive direction.

In each bottom cell string Bsj, bottom cells Bi adjacent to each other in the X-axis direction are electrically connected by second cell connects 311 respectively.

The second cell connect 311 is a conductor that electrically connects the negative electrode 306N and the positive electrode 306P that are adjacent to each other in the bottom cells Bi that are adjacent to each other in the X-axis direction.

The configuration of the second cell connect 311 is not particularly limited as long as it can electrically connect the negative electrode 306N and the positive electrode 306P. In the example shown in FIG. 6, the second cell connect 311 is a ribbon-shaped conductor covering the positive electrode 306P and the negative electrode 306N from below and extending in the X-axis direction. The width of the second cell connect 311 in the Y-axis direction is not particularly limited. In the example shown in FIG. 6, the length is about one-fifth of the length of the positive electrode 306P and the negative electrode 306N, but this length is not particularly limited either.

The position of the second cell connect 311 in the Y-axis direction is not particularly limited, but in the example shown in FIG. 6, it is the central portion of the positive electrode 306P and the negative electrode 306N in the Y-axis direction. For example, the center line in the Y-axis direction of the second cell connect 311 is located at a position that bisects the width y0 of the outer shape of the bottom cell Bi in the Y-axis direction.

The second cell connect 311, like the first cell connect 211, is joined to the positive electrode 306P and the negative electrode 306N by conductive paste, solder material, or the like.

Each positive electrode 306P and each negative electrode 306N of each bottom cell string Bsj electrically connected by the second cell connect 311 are provided on the back side where the incident light L' which is part of the incident light L is incident. Each positive electrode 306P and each negative electrode 306N of each bottom cell string Bsj is an example of a second electrode portion provided on the side opposite to the side facing the top cell string Tsj.

As shown in FIG. 6, the negative electrode 306N at the end of the bottom cell string Bs1 in the negative direction of the X axis (bottom cell Bn) is electrically connected by a second string connection 312 to the positive electrode 306P at the end of the bottom cell string Bs2 in the negative direction of the X axis.

The negative electrode 306N at the end of the bottom cell string Bs2 in the positive direction of the X axis (bottom cell B1) is electrically connected by a second string connection 312 to the positive electrode 306P at the end of the bottom cell string Bs3 in the positive direction of the X axis.

The negative electrode 306N at the end of the bottom cell string Bs3 in the negative direction of the X axis is electrically connected to the positive electrode 306P at the end of the bottom cell string Bs4 in the negative direction of the X axis by a second string connection 312.

The configuration of each second string connection 312 is not particularly limited as long as it can electrically connect the negative electrode 306N and the positive electrode 306P.

In the example shown in FIG. 6, all of the second string connections 312 have the same shape. Each second string connection 312 is a U-shaped ribbon-like conductor that opens in the X-axis direction in a plan view.

As shown in FIG. 4, the second string connection 312 includes a connecting portion 312a connected to the negative electrode 306N and the positive electrode 306P from below respectively, and a second extending portion 312b extending to the outside of the bottom cell module 3 in the plan view.

Each connecting portion 312a is arranged below the negative electrode 306N and the positive electrode 306P that are adjacent to each other in the Y-axis direction and is joined to the negative electrode 306N and the positive electrode 306P by, for example, a conductive paste or a solder material.

The arrangement position of each connecting portion 312a in the Y-axis direction is not particularly limited. In the example shown in FIG. 4, each connecting portion 312a is arranged at the central portion in the Y-axis direction of the negative electrode 306N and the positive electrode 306P.

The width of each connecting portion 312a in the Y-axis direction is shorter than the length of the negative electrode 306N and the positive electrode 306P in the Y-axis direction. In the example shown in FIG. 6, the width of each connecting portion 312a in the Y-axis direction is, like the width of the second cell connect 311, approximately one-fifth the length of the positive electrode 306P and the negative electrode 306N.

The arrangement position of each connecting portion 312a in the Y-axis direction is not particularly limited. In the example shown in FIG. 6, the center line in the Y-axis direction of each connecting portion 312a is located at a position that bisects the width y0 of the outer shape of the bottom cell Bi in the Y-axis direction, similarly to the second cell connect 311.

As shown in FIG. 4, the second extending portion 312b extends from each connecting portion 212a in the positive direction of the X-axis and extends outside the outline of each bottom cell B1 defined by the outline of the cell body 301 along a path that bends or curves in a U-shape in the plan view.

The width of the second extending portion 312b is not particularly limited. In the example shown in FIG. 4, after extending in the positive direction of the X-axis with the same width as the connecting portion 312a, the width is reduced to form a path that bends or curves with substantially the same width.

As shown in FIGS. 1 and 6, in the plan view, the second extending portions 312b surround the first extending portions 212b of the first string connectionors 212 from outside the top cell module 2 and the bottom cell module 3. As a result, in the plan view, the second extending portions 312b and the first extending portions 212b do not overlap and are separated from each other. The length of the second extending portion 312b is preferably shorter than the length of the first extending portion 212b. Each second extending portion 312b may surround the first extending portion 212b of the first string connection 212 from the outside of the top cell module 2 and the bottom cell module 3 in the plan view.

For example, in the example shown in FIG. 4, a linear portion 312c extending in the Y-axis direction outside each bottom cell B1 is formed at the distal end of the second extending portion 312b in the extending direction. Between the linear portion 312c and each bottom cell B1, a gap having a width d2 in the X-axis direction larger than the extension length d1 of the first extending portion 212b is formed.

In the example shown in FIG. 4, each connecting portion 312a and the second extending portion 312b of the second string connection 312 are formed of a single member that is U-shaped in the plan view, but the configuration of the second string connection 312 is not limited to this.

The second string connection 312 may be configured by joining a plurality of conductors together. For example, the second string connection 312 may have a first conductor similar to the second cell connect 311 and a second conductor joining the first conductors.

Each first conductor is joined to the lower side of the positive electrode 306P and the negative electrode 306N.

As the second conductor, a ribbon-shaped conductor that joins the first conductors in the Y-axis direction, a conductor having a U-shape in plan view similar to the linear portion 312c and having the U-shaped tip joined to each first conductor, or the like can be used.

In this case, the second string connection 312 has a U-shape in the plan view in which each first conductor and second conductor are joined. Each first conductor on positive electrode 306P and negative electrode 306N form a connection similar to connection 312a. Each first conductor and second conductor located outside the connecting portion of each bottom cell B1 form a second extending portion similar to the second extending portion 312b.

Specifically, such a configuration of the second string connection 312 can be formed as follows. For example, as first conductors, the positive electrode 306P and the negative electrode 306N are attached such that the second cell connect 311 extends from above the positive electrode 306P and the negative electrode 306N toward the outside of the bottom cell B1. After that, a second conductor corresponding to the linear portion 312 c formed of a ribbon-shaped conductor is coupled to each second cell connect 311.

Note that the planar view shape of the second conductor is not limited to a planar view U shape like the second string connection 312. The shape of the second conductor in the plan view does not matter as long as the first conductors of the second cell connect 311 can be connected to each other on the outside of each bottom cell B1.

As shown in FIG. 6, a second positive electrode terminal 310P is connected from below to the positive electrode 306P of the bottom cell B1 in the bottom cell string Bs1.

The configuration of the second positive electrode terminal 310P is not particularly limited as long as it can be electrically connected to the positive electrode 306P and can be connected to external wiring for extracting the output of the positive electrode of the bottom cell module 3 to the outside.

In the example shown in FIG. 3, the second positive electrode terminal 310P has a connecting portion 310a connected to the positive electrode 306P from below, and a third extending portion 310b extending outside the bottom cell module 3 in the plan view.

The connecting portion 310a has a width equal to or less than the lateral width of the positive electrode 306P in the X-axis direction, and a width equal to or less than the longitudinal width of the positive electrode 306P in the Y-axis direction. For example, the width of the connecting portion 310a in the Y-axis direction may be approximately the same as the width of the second cell connect 311 in the Y-axis direction.

A terminal electrode 310c is formed at the tip of the third extending portion 310b in the extending direction for the purpose of connecting an external wiring. The extension length in the X-axis direction and the width in the Y-axis direction of the third extending portion 310b are not particularly limited. In the example shown in FIG. 3, the extension length is equal to the extension length of the third extending portion 210b, and the width in the Y-axis direction is equal to the width of the connecting portion 310a.

For example, the second positive terminal 310P is made of the same conductor as the first negative terminal 210N.

The arrangement position of the second positive terminal 310P in the Y-axis direction is not particularly limited as long as it does not overlap the first negative terminal 210N, the first string connection 212, and the second string connection 312 in the plan view. In the example shown in FIG. 6, the second positive electrode terminal 310P is provided at the same position as the second cell connect 311 in the bottom cell B1 provided with the second positive electrode terminal 310P in the Y-axis direction.

A second negative terminal 310N is connected from below to the negative electrode 306N of the bottom cell Bi in the bottom cell string Bs4.

The configuration of the second negative electrode terminal 310N is not particularly limited as long as it can be electrically connected to the negative electrode 306N and can be connected to external wiring for extracting the output of the negative electrode of the bottom cell module 3 to the outside.

Like the second positive terminal 310P, the second negative terminal 310N includes a connecting portion 310a connected to the negative electrode 306N from below, and a third extending portion 310b extending outside the bottom cell module 3 in the plan view.

The shape of the second negative terminal 310N may be different from that of the second positive terminal 310P, but in the example shown in FIG. 6, it is the same as that of the second positive terminal 310P.

A terminal electrode 310c similar to the second positive electrode terminal 310P is formed at the tip of the second negative electrode terminal 310N in the extending direction of the third extending portion 310b.

For example, the second negative terminal 310N is formed of a conductor such as a ribbon-shaped metal wire made of the same material as the second positive terminal 310P, but the material and shape are not particularly limited as long as they are conductive.

The arrangement position of the second negative terminal 310N in the Y-axis direction is not particularly limited as long as it does not overlap the first positive terminal 210P, the first string connection 212, and the second string connection 312 in the plan view. In the example shown in FIG. 6, the second negative terminal 310N is provided at the same position as the second cell connect 311 in the bottom cell B1 provided with the second negative terminal 310N in the Y-axis direction.

An equivalent circuit of the bottom cell module 3 described above will be described.

Figure 9:
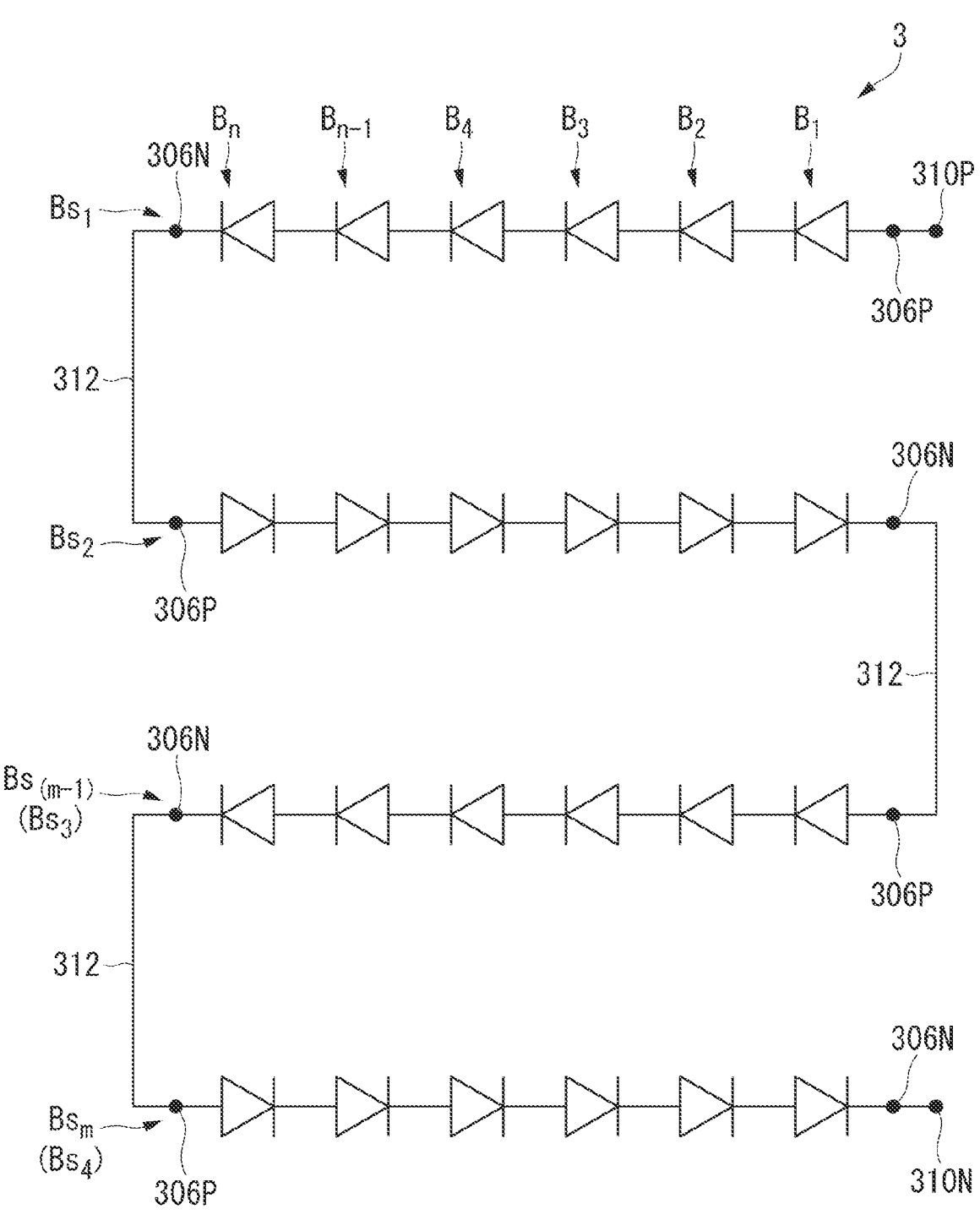
FIG. 9 is an equivalent circuit diagram of a bottom cell module in the tandem solar cell of the first embodiment.

FIG. 9 is an equivalent circuit diagram of the bottom cell module in the tandem solar cell of the first embodiment.

As shown in FIG. 9, the bottom cells B1-Bn in each bottom cell string Bsj are connected in series by a second cell connect 311.

The bottom cell strings Bs1-Bsm are connected in series by the second string connection 312.

The bottom cell module 3 has a circuit configuration in which n×m bottom cells Bi are connected in series.

The positive electrode 306P of the bottom cell B1 in the bottom cell string Bs1 is the positive electrode of the bottom cell module 3. The negative electrode 306N of the bottom cell B1 in the bottom cell string Bsm is the negative electrode of the bottom cell module 3.

The second positive electrode terminal 310P is connected to the positive electrode 306P, which is the positive electrode of the bottom cell module 3.

The second negative electrode terminal 310N is connected to the negative electrode 306N, which is the negative electrode of the bottom cell module 3.

When each bottom cell string Bsj of the bottom cell module 3 generates power due to incident light L' entering the bottom cell module 3, a voltage is generated between the second positive terminal 310P and the second negative terminal 310N. When an external load is connected to the second positive terminal 310P and the second negative terminal 310N, the power output can be extracted from the second positive terminal 310P and the second negative terminal 310N.

As described above, the tandem solar cell 1 includes the top cell module 2 that generates power from a portion of the incident light L, and the bottom cell module 3 that generates power from the incident light L' transmitted through the top cell module 2 and the insulating layer 4, which are stacked in the Z-axis direction.

In particular, since each bottom cell Bi in the bottom cell module 3 uses a back-contact solar cell, loss of light quantity due to reflection and absorption of incident light L' by cell contacts and electrodes is suppressed. As a result, the amount of power generated by the bottom cell module 3 can be increased.

The top cell module 2 has a first negative terminal 210N and a first positive terminal 210P as external output terminals. The bottom cell module 3 has a second positive terminal 310P and a second negative terminal 310N as external output terminals. That is, the tandem solar cell 1 includes a first negative terminal 210N, a first positive terminal 210P, a second positive terminal 310P, and a second negative terminal 310N, as four terminals that can independently extract the power output of each of the top cell module 2 and the bottom cell module 3 to the outside.

For example, a configuration is conceivable in which the top cell module and the bottom cell module in the tandem battery are electrically connected to each other in the tandem battery, and the power output of the tandem solar battery as a whole is extracted from two terminals, a positive terminal and a negative terminal. In this case, the connection form of the plurality of top cells and the connection form of the plurality of bottom cells need to be set so as to match the current ratio between the top cells and the bottom cells. The current ratio is the ratio of electric power generated by each of the top cell and the bottom cell when an assumed component of light is incident. For example, when the current ratio (top cell output current:bottom cell output current) is expressed as 1:α, α>1 because the bottom cell normally outputs more current.

In the tandem solar cell 1 of this embodiment, the power output of the top cell module 2 and the power output of the bottom cell module 3 can be extracted through independent circuits. Therefore, it is not necessary to set the connection form of each top cell Ti and the connection form of each bottom cell Bi to match the current ratio between the top cell Ti and the bottom cell Bi.

Therefore, the connection form of each top cell Ti and the connection form of each bottom cell Bi can be freely set.

However, when comparing the rated output voltages of the top cell Ti and the bottom cell Bi of the same size, the rated output voltage of the top cell Ti is significantly higher than the rated output voltage of the bottom cell Bi. For example, the rated output voltage of the top cell Ti is approximately 40 times the rated output voltage of the bottom cell Bi. Here, the rated output voltage means the voltage of the top cell Ti generated between the first negative electrode terminal 210N and the first positive electrode terminal 210P when the sunlight of AM1.5 is vertically incident, and 310N and the voltage of the bottom cell Bi generated between the second positive terminal 310P.

As the tandem solar cell 1, the top cell Ti has an efficiency of 10% and the bottom cell Bi has an efficiency of 20%, so that the total efficiency of power generation is 30%. The efficiency and power generation of the top cell module 2 are half of the efficiency and power generation of the bottom cell module 3, respectively. The fact that the rated output voltage is about 40 times higher means that the rated output current is about ⅛₀th lower than that of the bottom cell module 3. This means that the current and voltage specifications of the external circuit that extracts power are very different for the top and bottom cells. Therefore, it is more preferable that the rated output voltage of the top cell module 2 be close to the rated voltage and rated current of the bottom cell module 3.

For example, in the top cell module 2, the rated output voltage of the top cell module 2 can be reduced by increasing the number of top cells Ti connected in parallel.

A tandem solar cell as a comparative example will be used to explain the problem when increasing the number of top cells Ti connected in parallel.

Figure 10:
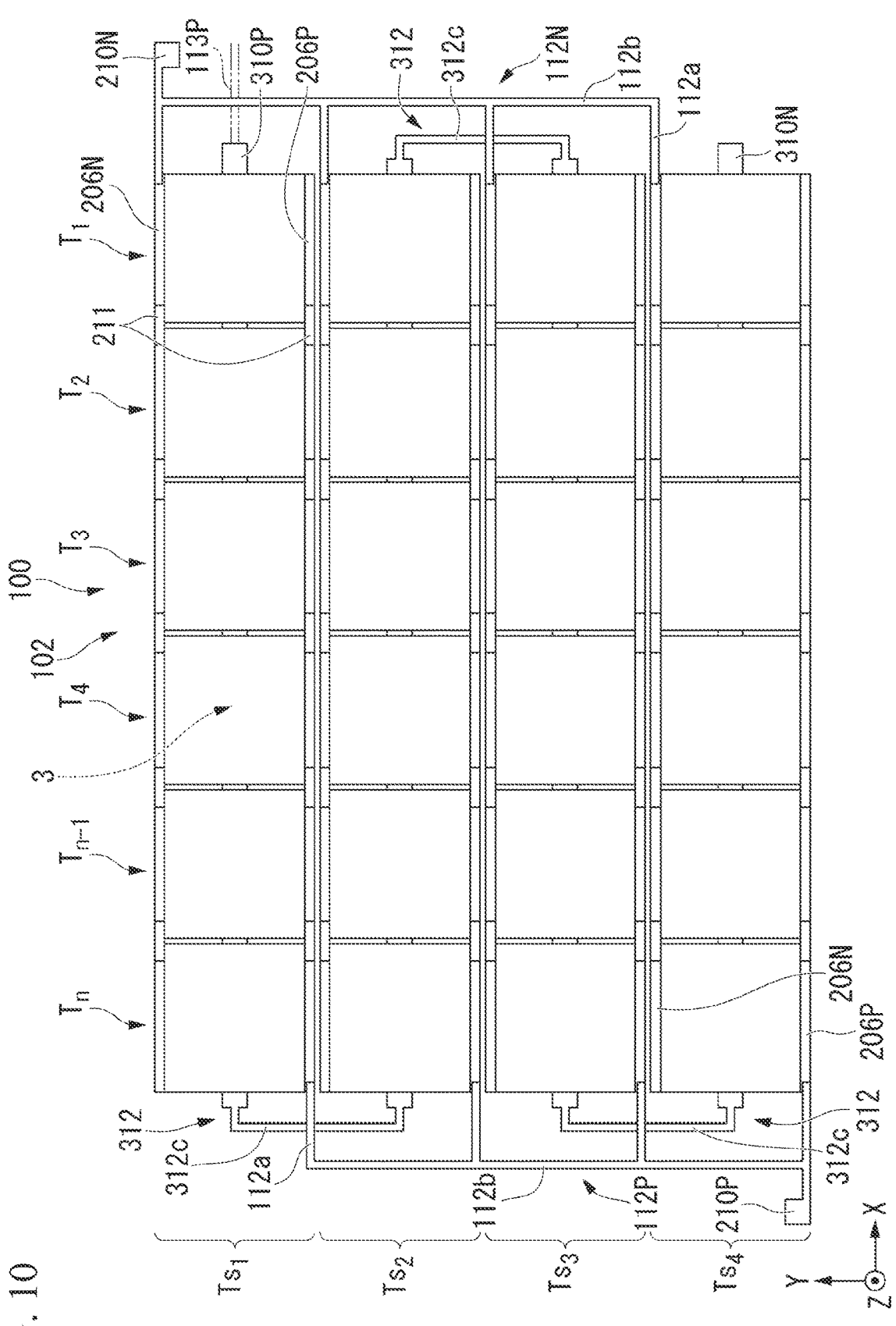
FIG. 10 is a plan view showing an example of a tandem solar cell of a comparative example.

FIG. 10 is a plan view showing an example of a tandem solar cell as a comparative example.

As shown in FIG. 10, the tandem solar cell 100 of the comparative example has a top cell module 102 instead of the top cell module 2 of the tandem solar cell 1. In the following, differences from the tandem solar cell 1 of this embodiment will be mainly described. However, n=6 and m=4.

The top cell module 102 is the same as the top cell module 2 except that it has string connections 112P and 112N connecting the top cell strings Ts1-Ts4 in parallel instead of the three first string connections 212. In the top cell module 102, all top cells Ti are connected in parallel.

The string connection 112P electrically connects the positive electrodes of the top cell strings Tsj. The string connection 112P has a first linear portion 112a and a second linear portion 112b.

The first linear portion 112a is a conductor connected to the positive electrode 206P of each top cell Tn and extending from each top cell T6 in the negative direction of the X axis in the plan view.

The second linear portion 112b is a linear conductor that conducts with the tip of each first linear portion 112a in the extending direction. The second linear portion 112b extends in the Y-axis direction at a position spaced apart in the X-axis negative direction from the end of each top cell T6 in the X-axis negative direction. In the plan view, the second linear portion 112b is positioned in the X-axis negative direction relative to the second string connection 312 arranged outside the bottom cell module 3 in the X-axis negative direction.

A first positive electrode terminal 210P is connected to the connecting portion between the first linear portion 112a positioned most in the Y-axis negative direction and the end portion of the second linear portion 112b in the Y-axis positive direction.

For example, the first linear portion 112 a and the second linear portion 112 b are made of the same conductor as the first string connection 212.

The string connection 112N electrically connects the negative electrodes of the top cell strings Tsj. The string connection 112N has a first linear portion 112a and a second linear portion 112b.

The first linear portion 112a of the string connection 112N is connected to the negative electrode 206N of each top cell T1 and extends from each top cell T1 in the positive direction of the X axis in the plan view, and otherwise, it is the same as the first linear portion 112a of the string connection 112P.

The second linear portion 112b of the string connection 112N is a linear conductor that conducts with the tip in the extending direction of each first linear portion 112a of the string connection 112N. The second linear portion 112b of the string connection 112N is the same as the second linear portion 112b of the string connection 112P except that it extends in the Y-axis direction at a position spaced apart in the positive X-axis direction from the end of each top cell T1 in the positive X-axis direction. The second linear portion 112b of the string connection 112N is positioned in the positive X-axis direction relative to the second string connections 312 arranged outside the bottom cell module 3 in the positive X-axis direction in the plan view.

In the string connection 112N, the first negative terminal 210N is connected to the connecting portion between the first linear portion 112a positioned most in the Y-axis positive direction and the end portion of the second linear portion 112b in the Y-axis negative direction.

In the tandem solar cell 100, in order to connect the top cell strings Tsj in parallel, it is necessary that the first linear portions 112a extend outward from at least the negative electrodes 206N and the positive electrodes 206P at both ends in the X-axis direction, and the first linear portions 112a at both ends are electrically connected by the second linear portions 112b.

As a result, the linear portion 312c of each second string connection 312 has a positional relationship that crosses the first linear portion 112a in the plan view. When the wiring 113P is connected to the second positive electrode terminal 310P, the wiring 113P and the first linear portion 112a are positioned to intersect in the plan view. When the extension length of the second positive electrode terminal 310P is longer than the first linear portion 112a, the second positive electrode terminal 310P and the first linear portion 112a are positioned to intersect in the plan view.

In the plan view, the linear portion 312c, the wiring 113P, or the second positive terminal 310P, which are in a positional relationship that intersects with the first linear portion 112a, are separated in the Z-axis direction, but if an external force acts in the Z-axis direction, they may come into contact with each other and short-circuit.

In order to prevent a short circuit, it is necessary to insert an insulator between the first linear portion 112a and the linear portion 312c, the wiring 113P, or the second positive electrode terminal 310P. Therefore, the outer configuration of the top cell module 102 and the bottom cell module 3 becomes complicated, and the size in the plan view also increases.

On the other hand, in the tandem solar cell 1 according to the first embodiment, the first string connections 212 are arranged in a positional relationship such that they do not intersect with the second string connections 312 in the plan view. Therefore, it is not necessary to arrange an insulator for short-circuit prevention between the first string connection 212 and the second string connection 312. The same applies to the relationship between the first string connection 212 and the second positive terminal 310P and the second negative terminal 310N.

As a result, in the tandem solar cell 1, the outer configuration of the top cell module 2 and the bottom cell module 3 is simplified.

For example, in the tandem solar cell 1, when protective films are laminated on the upper and lower surfaces of the tandem solar cell 1 to respectively seal the tandem solar cell 1 in the vertical direction, each protective film can surround each first string connection 212 and each second string connection 312, without arranging an insulator for short-circuit prevention between the first string connection 212 and the second string connection 312.

Furthermore, in the tandem solar cell 100 of the comparative example, it is necessary to arrange the second linear portion 112b outside the linear portion 312c. On the other hand, in the tandem solar cell 1 of the present embodiment, the first string connection 212 can be arranged inside the linear portion 312c, so that the outer shape can be reduced at both ends in the X-axis direction.

In the tandem solar cell 100 of the comparative example, it is also conceivable to dispose the second linear portion 112b inside the linear portion 312c. However, in this case, since the second linear portion 112b intersects the linear portion 312c in more places in a plan view, it is necessary to dispose the short-circuit-preventing frame in a wider range.

According to the tandem solar cell 1 of the present embodiment, by appropriately setting the number n, the rated output voltage in the top cell string Tsj in which n top cells Ti are connected in parallel can be made close to the rated output voltage in each bottom cell string Bsj in which n bottom cells Bi are connected in series. Thereby, a connection form matching the current ratio between the top cell Ti and the bottom cell Bi is obtained.

According to the first embodiment described above, it is possible to provide a tandem solar cell capable of improving insulation between the top cell module and the bottom cell module with a simple configuration.

Second Embodiment

The tandem solar cell of the second embodiment will be described.

Figure 11:
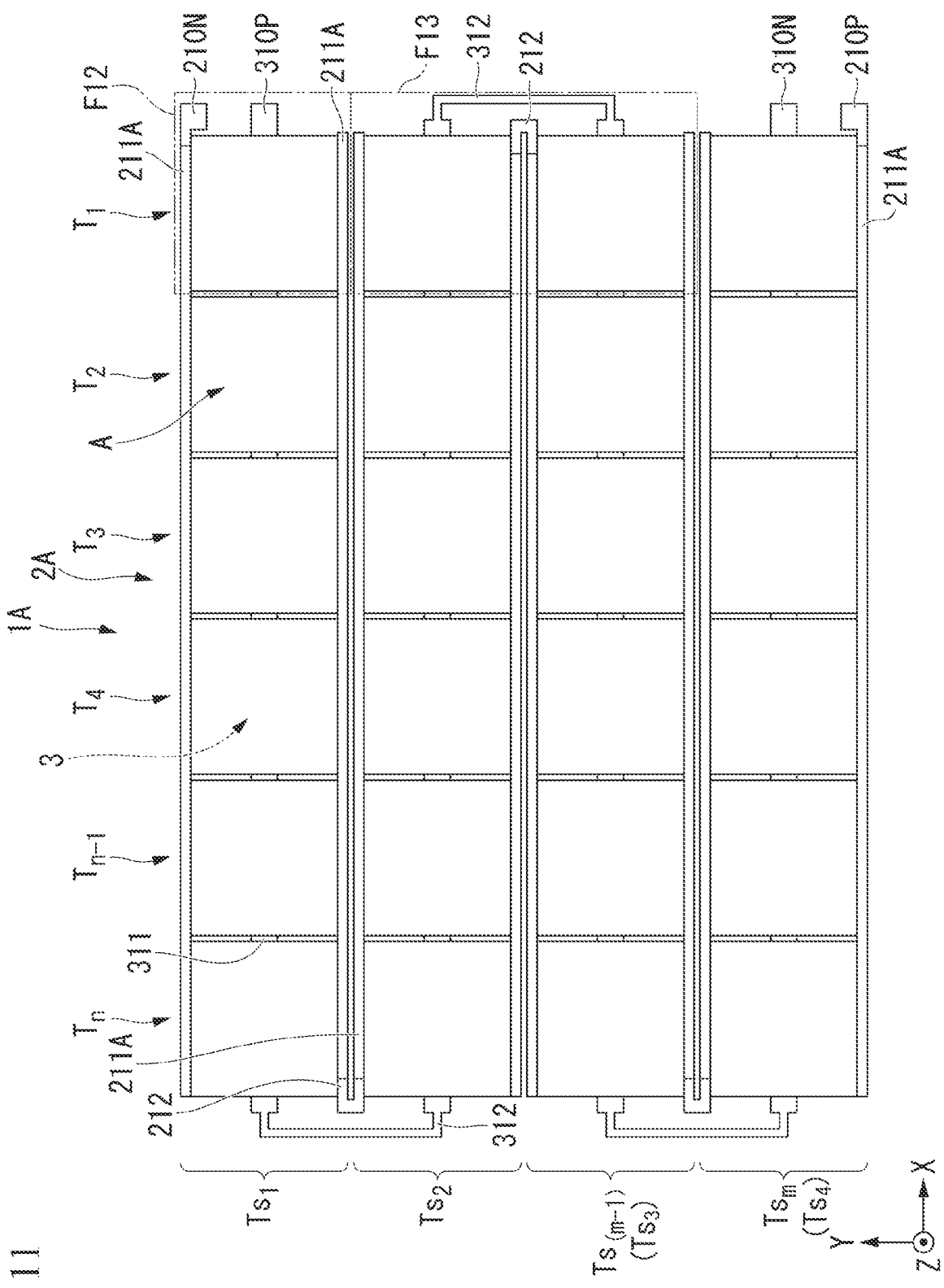
FIG. 11 is a plan view showing an example of a tandem solar cell according to a second embodiment.
Figure 12:
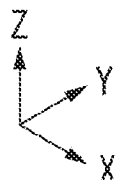
FIG. 12 is a perspective view of the F12 portion in FIG. 11.
Figure 13:
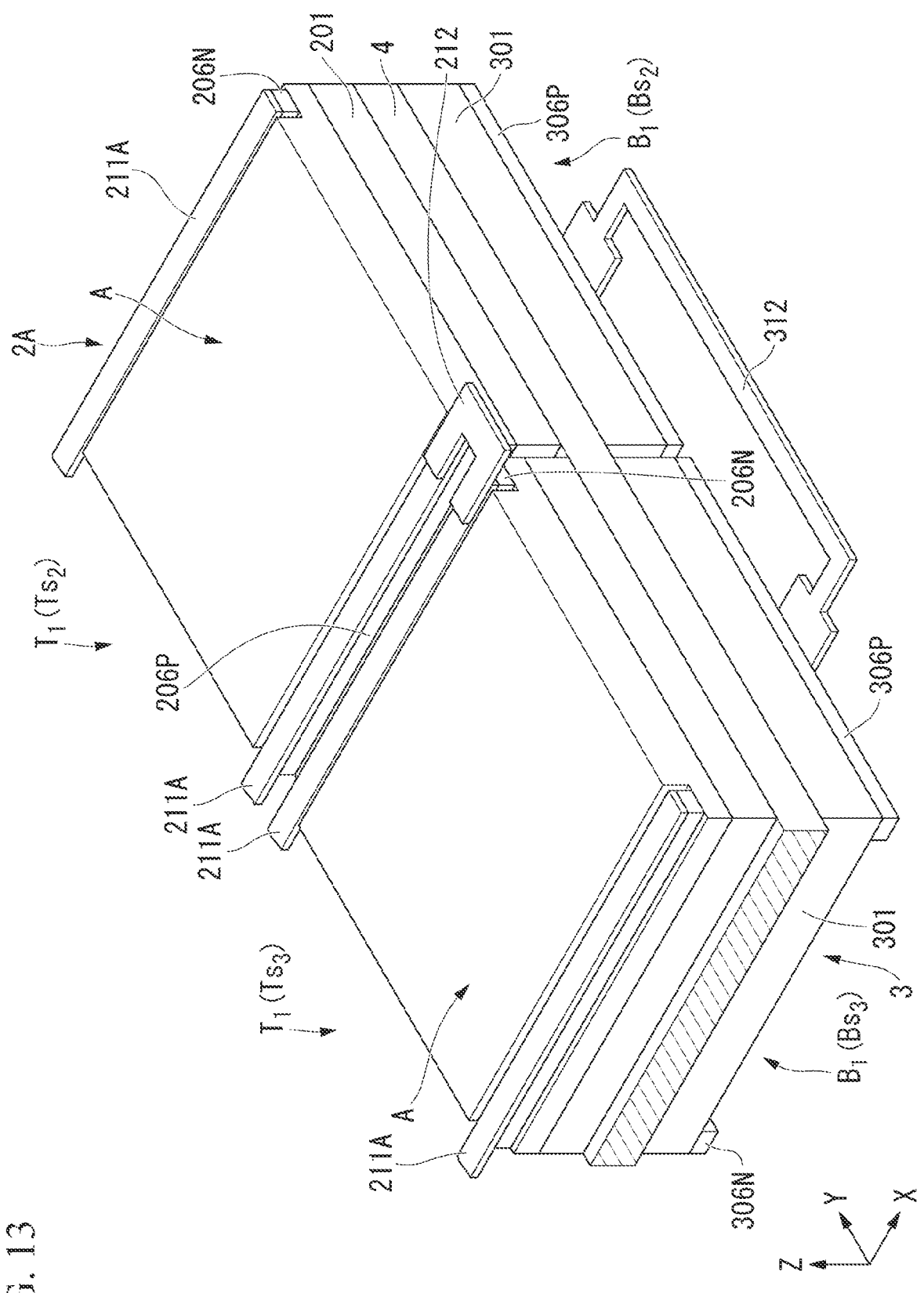
FIG. 13 is a perspective view of the F13 portion in FIG. 11.

FIG. 11 is a plan view showing an example of the tandem solar cell of the second embodiment. FIG. 12 is a perspective view of the F12 portion in FIG. 11. FIG. 13 is a perspective view of the F13 portion in FIG. 11.

As shown in FIG. 11, the tandem solar cell 1A of this embodiment includes a top cell module 2A instead of the top cell module 2 in the tandem solar cell 1 of the first embodiment. The top cell module 2A includes a first cell connect 211A instead of the first cell connect 211. The tandem solar cell 1A has a bottom cell module 3 similar to that of the first embodiment.

The following description will focus on points that differ from the first embodiment.

The first cell connect 211A is the same as the first cell connect 211 except that it has a different length. The first cell connect 211A has a length similar to that of each top cell string Tsj in the X-axis direction.

Each first cell connection 211A straddles different top cells Ti in each top cell string Tsj and is arranged above the entire of the negative electrode 206N and the entire of the positive electrode 206P in the X-axis direction. Each first cell connect 211A is joined to each negative electrode 206N and each positive electrode 206P in the same manner as the first cell connect 211.

As shown in FIG. 12, the first negative terminal 210N in this embodiment is arranged in the same manner as in the first embodiment except that it is joined to the upper side of the first cell connect 211A. Therefore, as shown in FIG. 11, the layout of the first negative terminal 210N in the plan view is the same as in the first embodiment. Although a perspective illustration is omitted, the first positive electrode terminal 210P is also arranged in the same manner as in the first embodiment except that it is joined to the upper side of the first cell connect 211A. Therefore, as shown in FIG. 11, the arrangement of the first positive terminal 210P in the plan view is the same as in the first embodiment.

As an example is shown in FIG. 13, the first string connection 212 in this embodiment is arranged in the same manner as in the first embodiment except that it is joined onto the first cell connect 211A. Therefore, as shown in FIG. 11, the layout of the first string connections 212 in the plan view is the same as in the first embodiment.

In this embodiment, the first cell connect 211A electrically connects each negative electrode 206N or each positive electrode 206P of each top cell string Tsj. Therefore, each first cell connect 211A is an example of a first electrode portion provided on the surface opposite to the surface facing each bottom cell string Bsj.

According to the tandem solar cell 1A of the present embodiment, the top cell module 2A has the top cells Ti arranged in n parallel and m series, as in the first embodiment. Therefore, the tandem solar cell 1A has a circuit configuration similar to that of the tandem solar cell 1.

Therefore, according to the second embodiment, as in the first embodiment, it is possible to provide a tandem solar cell capable of improving insulation between the top cell module and the bottom cell module with a simple configuration.

In particular, according to this embodiment, after the first cell connect 211A is arranged on the n negative electrodes 206N or the n positive electrodes 206P, the first cell connect 211A can be joined to the n negative electrodes 206N or the n positive electrodes 206P. Therefore, the first cell connect 211A can be arranged more easily and quickly than when n first cell connects 211 are arranged.

Third Embodiment

The tandem solar cell of the third embodiment will be described.

Figure 14:
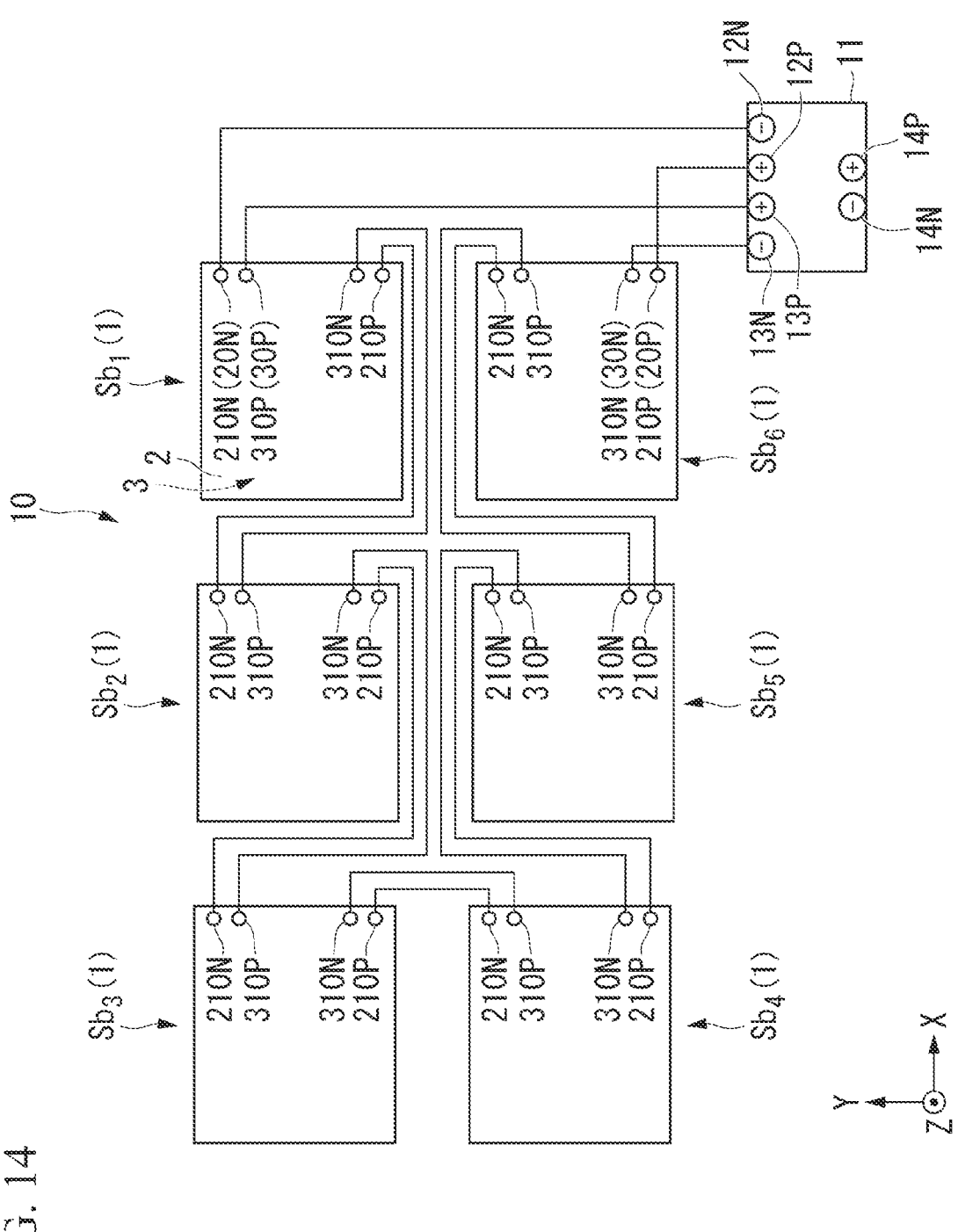
FIG. 14 is a plan view showing an example of a tandem solar cell according to a third embodiment.

FIG. 14 is a plan view showing an example of the tandem solar cell of the third embodiment.

As shown in FIG. 14, the tandem solar cell 10 of this embodiment is formed by connecting a plurality of the tandem solar cells 1 of the first embodiment. The following description will focus on the differences from the first embodiment.

Although the number of tandem solar cells 1 is not particularly limited, six tandem solar cells 1 are connected in the example shown in FIG. 14. When tandem solar cells 1 are distinguished from each other, they are described as tandem solar cells Sb1, Sb2, Sb3, Sb4, Sb5, and Sb6, respectively. The tandem solar cells Sb1, Sb2, Sb3, Sb4, Sb5, and Sb6 may be collectively referred to as "tandem solar cells Sb1-Sb6."

Each of the tandem solar cells Sb1-Sb6 has a top cell module 2 and a bottom cell module 3 as in the first embodiment. In the tandem solar cells Sb1-Sb6, the top cell modules 2 and the bottom cell modules 3 are connected in series.

In the example shown in FIG. 14, tandem solar cells Sb1, Sb2, and Sb3 are arranged in this order in the negative direction of the X axis. The tandem solar cells Sb4, Sb5 and Sb6 are arranged in the Y-axis positive direction of the tandem solar cells Sb1, Sb2 and Sb3, respectively.

The first positive terminal 210P and the second negative terminal 310N of the tandem solar cell Sb1 are electrically connected to the first negative terminal 210N and the second positive terminal 310P of the tandem solar cell Sb2 via wiring, respectively. The tandem solar cells Sb2 and Sb3, the tandem solar cells Sb3 and Sb4, the tandem solar cells Sb4 and Sb5, and the tandem solar cells Sb5 and Sb6 are similarly electrically connected via wiring.

With such a connection, the first negative terminal 210N in the tandem solar cell Sb1 is the first negative terminal 20N, which is a negative terminal for taking out the overall power output of the top cell modules 2 connected in series. Similarly, the first positive electrode terminal 210P in the tandem solar cell Sb6 is the first positive electrode terminal 20P that is a positive electrode terminal that extracts the power output of the entire top cell modules 2 connected in series.

The second positive electrode terminal 310P in the tandem solar cell Sb1 is the second positive electrode terminal 30P that is a positive electrode terminal that extracts the power output of the entire bottom cell modules 3 connected in series. Similarly, the second negative terminal 310N in the tandem solar cell Sb6 is the second negative terminal 30N, which is a negative terminal for taking out the overall power output of the bottom cell modules 3 connected in series.

A first positive terminal 20P and a first negative terminal 20N are wired to input terminals 12P and 12N of a PCS (Power Conditioning System) 11, respectively.

The second positive terminal 30P and the second negative terminal 30N are wired to the input terminals 13P and 13N of the PCS 11, respectively.

The PCS 11 outputs the power output of the tandem solar cell 10 input to the input terminals 12P, 12N, 13P and 13N as DC output from the output terminals 14P and 14N.

The tandem solar cell 10 of the present embodiment includes tandem solar cells Sb1-Sb6, which are examples of tandem modules in which a top cell module and a bottom cell module overlap in the thickness direction. The top cell modules 2 in each tandem module are electrically connected to each other, and the bottom cell modules 3 are electrically connected to each other.

The tandem solar cell 10 has a first positive terminal 20P, a first negative terminal 20N, a second positive terminal 30P, and a second negative terminal 30N.

The first positive electrode terminal 20P is electrically connected to the positive electrode (first positive electrode terminal 210P) of the top cell module 2 in the tandem solar cell Sb1, which is one of the tandem modules.

The first negative electrode terminal 20N is electrically connected to the negative electrode (first negative electrode terminal 210N) of the top cell module 2 in the tandem solar cell Sb6, which is one of the tandem modules.

The second positive electrode terminal 30P is electrically connected to the positive electrode (second positive electrode terminal 310P) of the bottom cell module 3 in the tandem solar cell Sb1, which is one of the plurality of tandem modules.

The second negative electrode terminal 30N is electrically connected to the negative electrode (second negative electrode terminal 310N) of the bottom cell module 3 in the tandem solar cell Sb6, which is one of the tandem modules.

The tandem solar cell 10 of this embodiment is the same as the first embodiment except that the top cell module 2 and the bottom cell module 3 are divided into a plurality of tandem modules. Therefore, as in the first embodiment, it is possible to provide a tandem solar cell capable of improving insulation between the top cell module and the bottom cell module with a simple configuration in each tandem module.

Modifications of each of the above-described embodiments will be described below.

In particular, the first to sixth modifications described later are modifications regarding the arrangement of the first string connection 212 and the first negative electrode terminal 210N in the top cell module 2s, 2A in the first or second embodiment. The first to sixth modifications differ only in the configurations of the tandem solar cells 1, 1A and the top cell modules 2, 2A. However, the connection form of each top cell module will be described using an example of 6 parallel 4 series.

The seventh and eighth modifications to be described later include modifications of the arrangement of the cell connects of the bottom cell module.

First Modification

Figure 15:
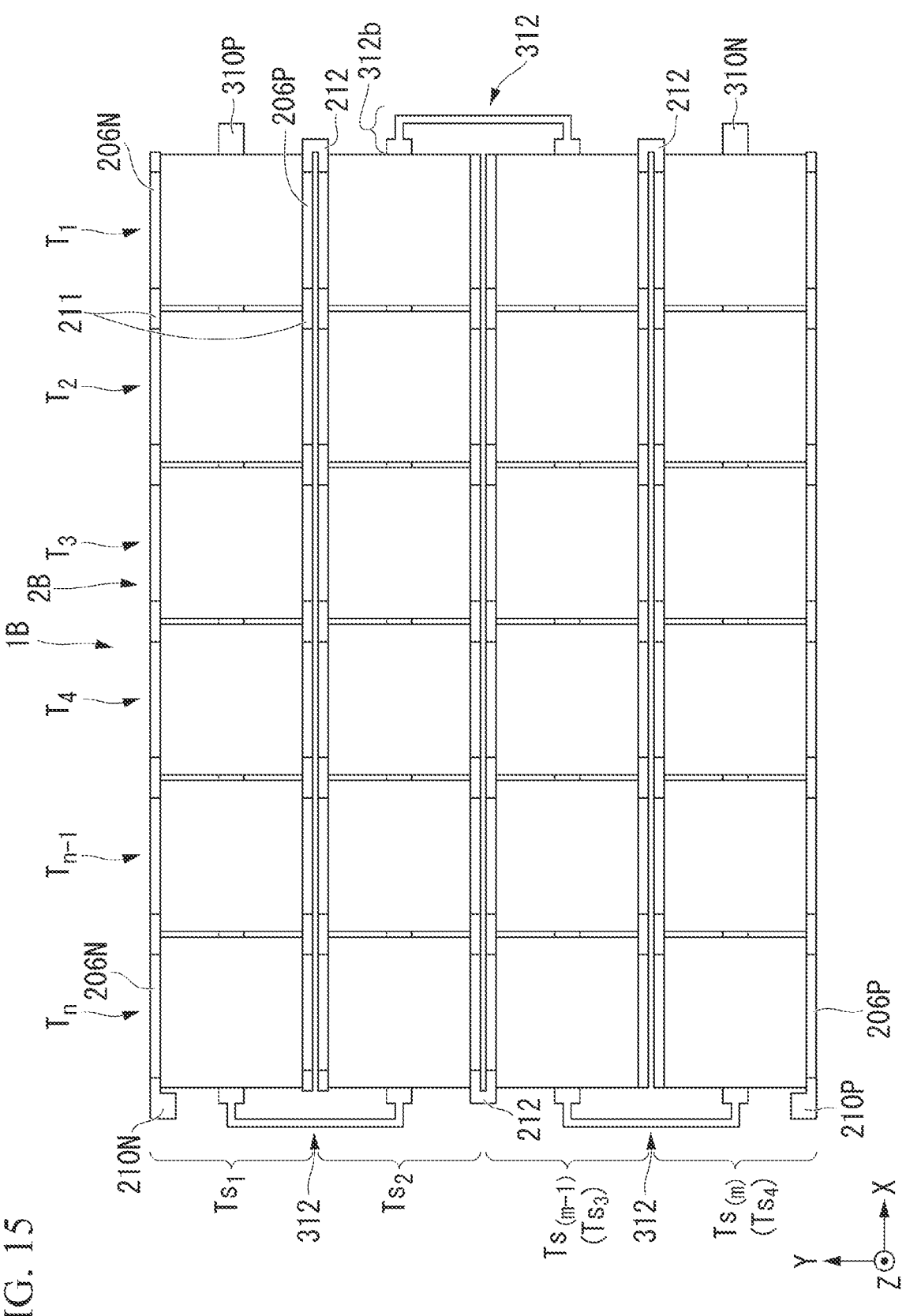
FIG. 15 is a plan view showing an example of a tandem solar cell of the first modification.

FIG. 15 is a plan view showing an example of a tandem solar cell of the first modification.

As shown in FIG. 15, the tandem solar cell 1B of this modification has a top cell module 2B instead of the top cell module 2 of the tandem solar cell 1 of the first embodiment. The following description will focus on the differences from the first embodiment.

In the top cell module 2B, the arrangement position of each first string connection 212 in the X-axis direction is opposite to the arrangement position of each first string connection 212 in the top cell module 2B. Further, in the top cell module 2B, the first negative electrode terminal 210N is joined from above to the negative electrode 206N at the end of the top cell string Ts1 in the X-axis negative direction, and the first positive electrode terminal 210P is joined from above to the positive electrode 206P at the end of the top cell string Ts4 in the negative direction of the X axis.

The top cell module 2B is the same as the top cell module 2 in the first embodiment except for the above two points.

In this modification, the top cell strings Ts1 and Ts2 are electrically connected by a first string connection 212 joined from above to the negative electrode 206N and the positive electrode 206P at the ends in the positive direction of the X axis. The same applies to the top cell strings Ts3 and Ts4. The top cell strings Ts2 and Ts3 are electrically connected by a first string connection 212 joined from above to the negative electrode 206N and the positive electrode 206P at the ends in the negative direction of the X axis.

In this modification, the second extending portion 312b of the second string connection 312 is adjacent to the first extending portion 212b of the first string connection 212 in the Y-axis direction in the plan view. Adjacent means that the first extending portion 212*b* and the second extending portion 312*b* do not overlap each other in the plan view. Therefore, in this modification, the first extending portion 212*b* and the second extending portion 312*b* are arranged apart from each other in the plan view.

In this modification, unlike the first embodiment, the second extending portion 312*b* does not surround any first extending portion 212*b* from the outside in the plan view. Therefore, for example, the extension length in the X-axis direction of the second extending portion 312*b* can be made shorter than in the first embodiment. Furthermore, the separation distance between the first string connection 212 and the second string connection 312 in the plan view can be increased. As a result, in this modification, it is possible to further improve the insulation between the first string connection 212 and the second string connection 312.

Furthermore, in this modification, the first negative terminal 210N and the first positive terminal 210P are provided on the opposite side of the second positive terminal 310P and the second negative terminal 310N in the X-axis direction.

As a result, the output of the top cell module 2B and the power output of the bottom cell module 3 can be extracted from different directions in the X-axis direction.

According to this modification, it is possible to provide a tandem solar cell capable of improving insulation between the top cell module and the bottom cell module with a simple configuration.

In particular, according to this modification, the first string connection 212 connecting the top cell strings Tsj adjacent to each other in the Y-axis direction and the second string connection 312 connecting the bottom cell strings Bsj overlapping the top cell strings Tsj can be connected at opposite positions in the X-axis direction. This allows the first string connection 212 and the second string connection 312 to be separated from each other.

It should be noted that in this modification, one of the first negative terminal 210N and the first positive terminal 210P may be provided at the same position as in the second modification.

Second Modification

Figure 16:
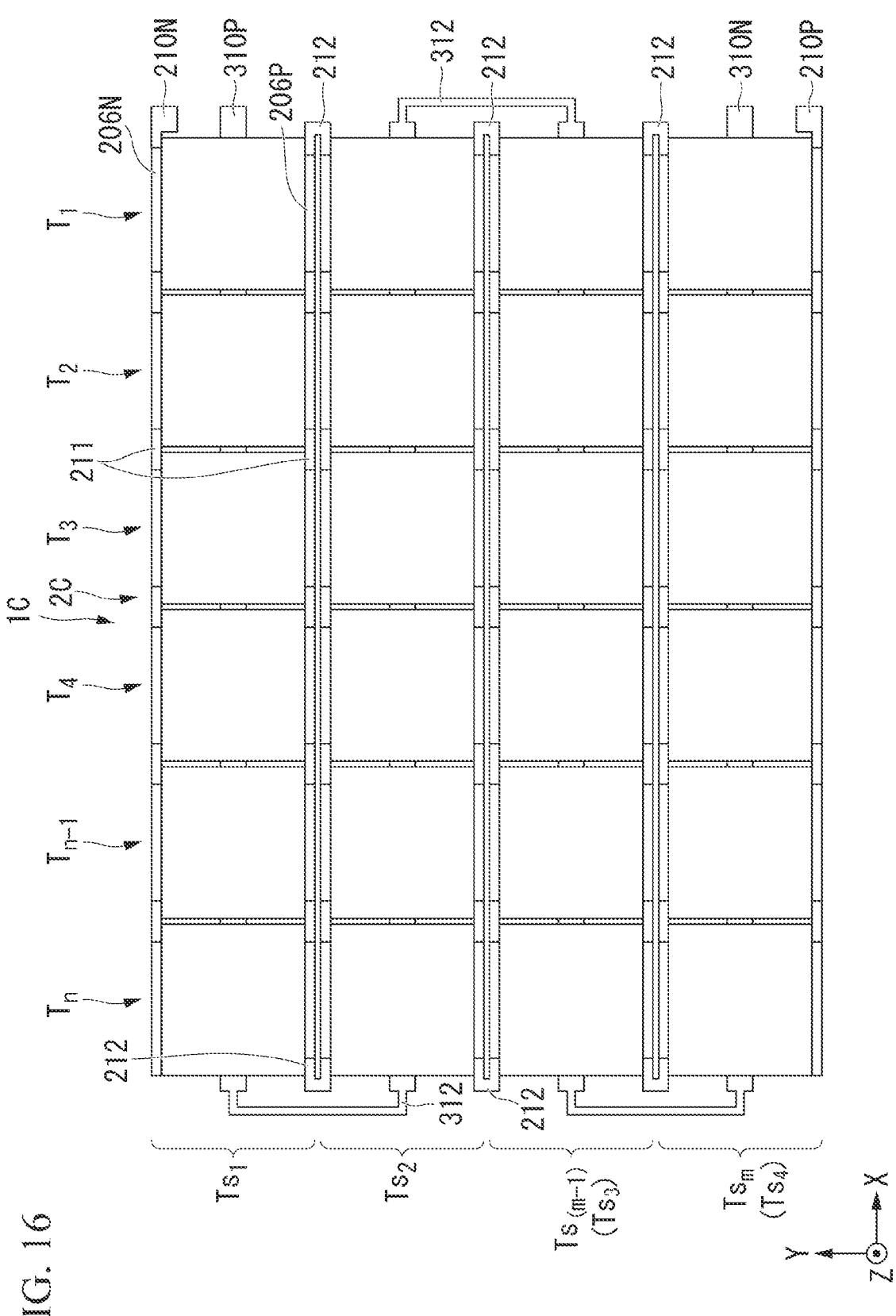
FIG. 16 is a plan view showing an example of a tandem solar cell of a second modification.

FIG. 16 is a plan view showing an example of a tandem solar cell of the second modification.

As shown in FIG. 16, the tandem solar cell 1C of this modification has a top cell module 2C instead of the top cell module 2 of the tandem solar cell 1 of the first embodiment. The following description will focus on the differences from the first embodiment.

The top cell module 2C has three first string connections 212 added in addition to the same first string connections 212 as in the first embodiment.

The added first string connection 212 is arranged at the same position as each first string connection 212 in the first modification.

Thus, in this modification, the negative electrode 206N and the positive electrode 206P at both ends in the X-axis direction of the top cell strings Ts1-Ts4 are electrically connected by the first string connection 212, respectively.

According to this modification, it is possible to provide a tandem solar cell capable of improving insulation between the top cell module and the bottom cell module with a simple configuration.

Third Modification

Figure 17:
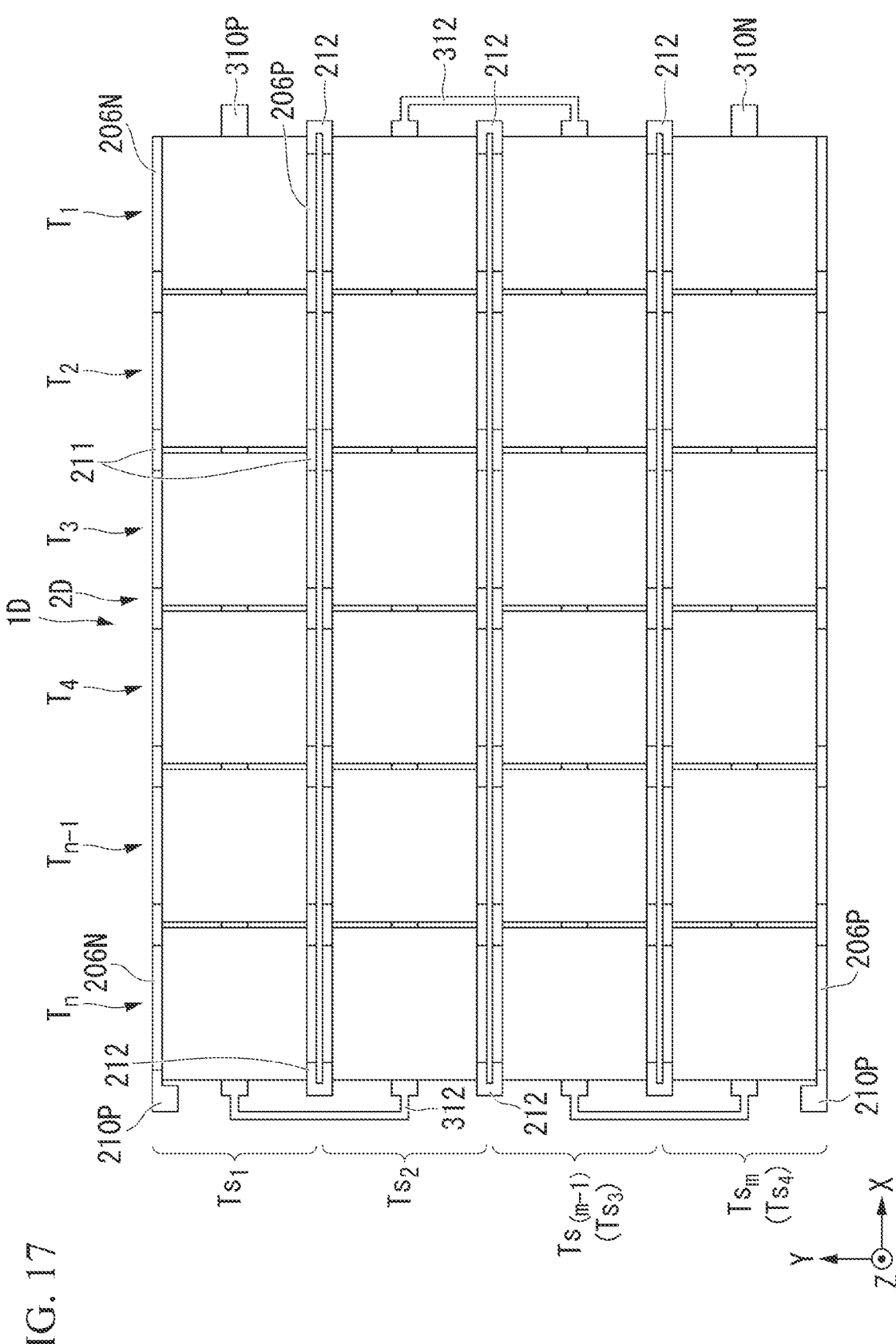
FIG. 17 is a plan view showing an example of a tandem solar cell of a third modification.

FIG. 17 is a plan view showing an example of a tandem solar cell of the third modification.

As shown in FIG. 17, the tandem solar cell 1D of this modification has a top cell module 2D instead of the top cell module 2C of the tandem solar cell 1C of the second modification. In the following, the points different from the second modification will be mainly described.

In the top cell module 2D, as in the first modification, the first negative terminal 210N and the first positive terminal 210P are provided on the opposite side of the second positive terminal 310P and the second negative terminal 310N in the X-axis direction, and otherwise, it is the same as the second modification.

According to this modification, it is possible to provide a tandem solar cell capable of improving insulation between the top cell module and the bottom cell module with a simple configuration.

Fourth Modification

Figure 18:
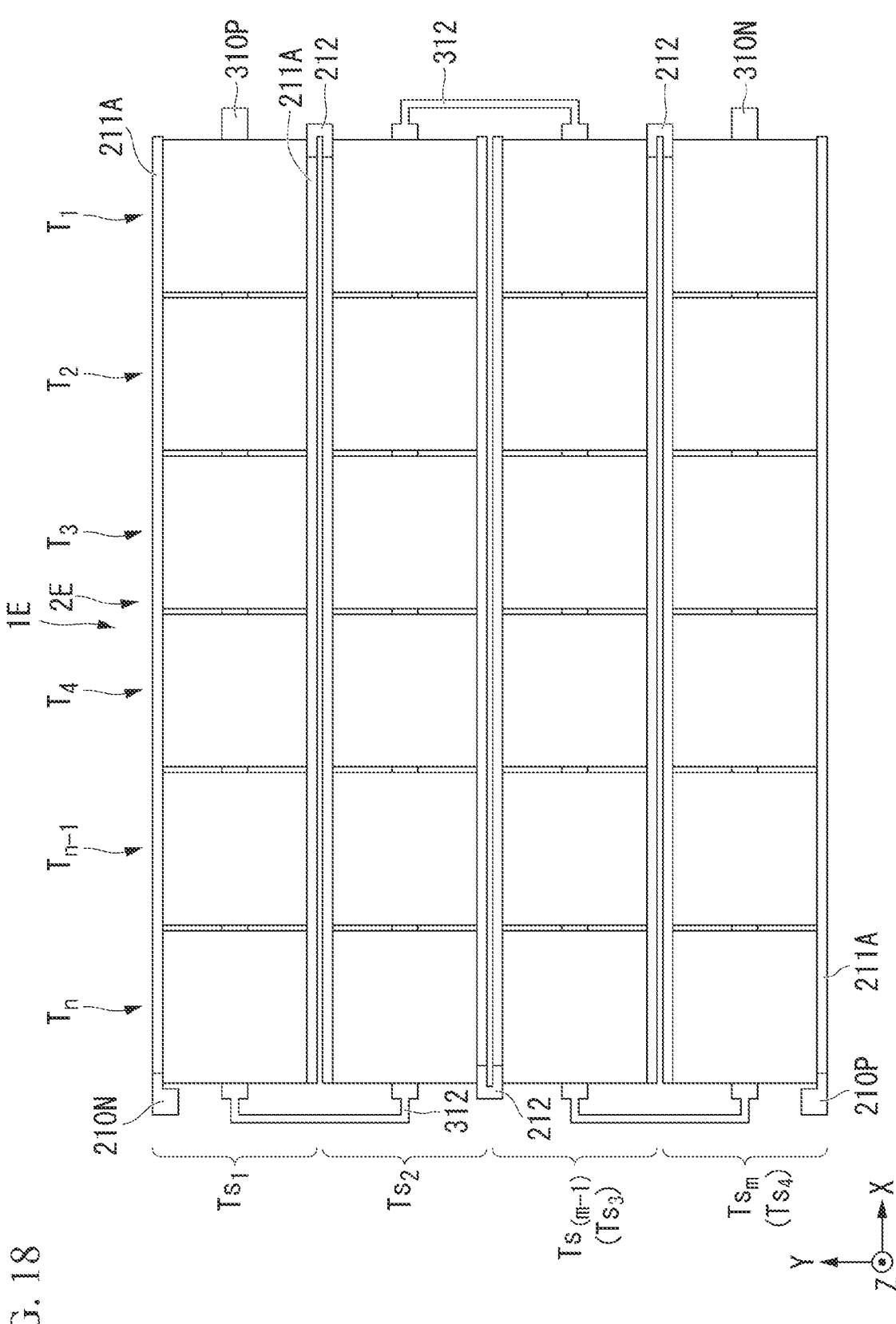
FIG. 18 is a plan view showing an example of a tandem solar cell of a fourth modification.

FIG. 18 is a plan view showing an example of a tandem solar cell of the fourth modification.

As shown in FIG. 18, the tandem solar cell 1E of this modification has a top cell module 2E instead of the top cell module 2A of the tandem solar cell 1A of the second embodiment. In the following, the points different from the second embodiment will be mainly described.

In the top cell module 2E, the arrangement position of each first string connection 212 in the X-axis direction is opposite to the arrangement position of each first string connection 212 in the top cell module 2A. Furthermore, in the top cell module 2E, the first negative terminal 210N is connected from above to the first cell connect 211A at the end of the top cell string Ts1 in the negative direction of the X axis, and the first positive terminal 210P is joined from above to the first cell connect 211A at the end of the top cell string Ts4 in the negative direction of the X axis.

The top cell module 2E is the same as the top cell module 2A in the second embodiment except for the above two points. That is, this modification is an example in which the tandem solar cell 1A of the second embodiment is modified in the same manner as in the first modification.

According to this modification, it is possible to provide a tandem solar cell capable of improving insulation between the top cell module and the bottom cell module with a simple configuration.

Fifth Modification

Figure 19:
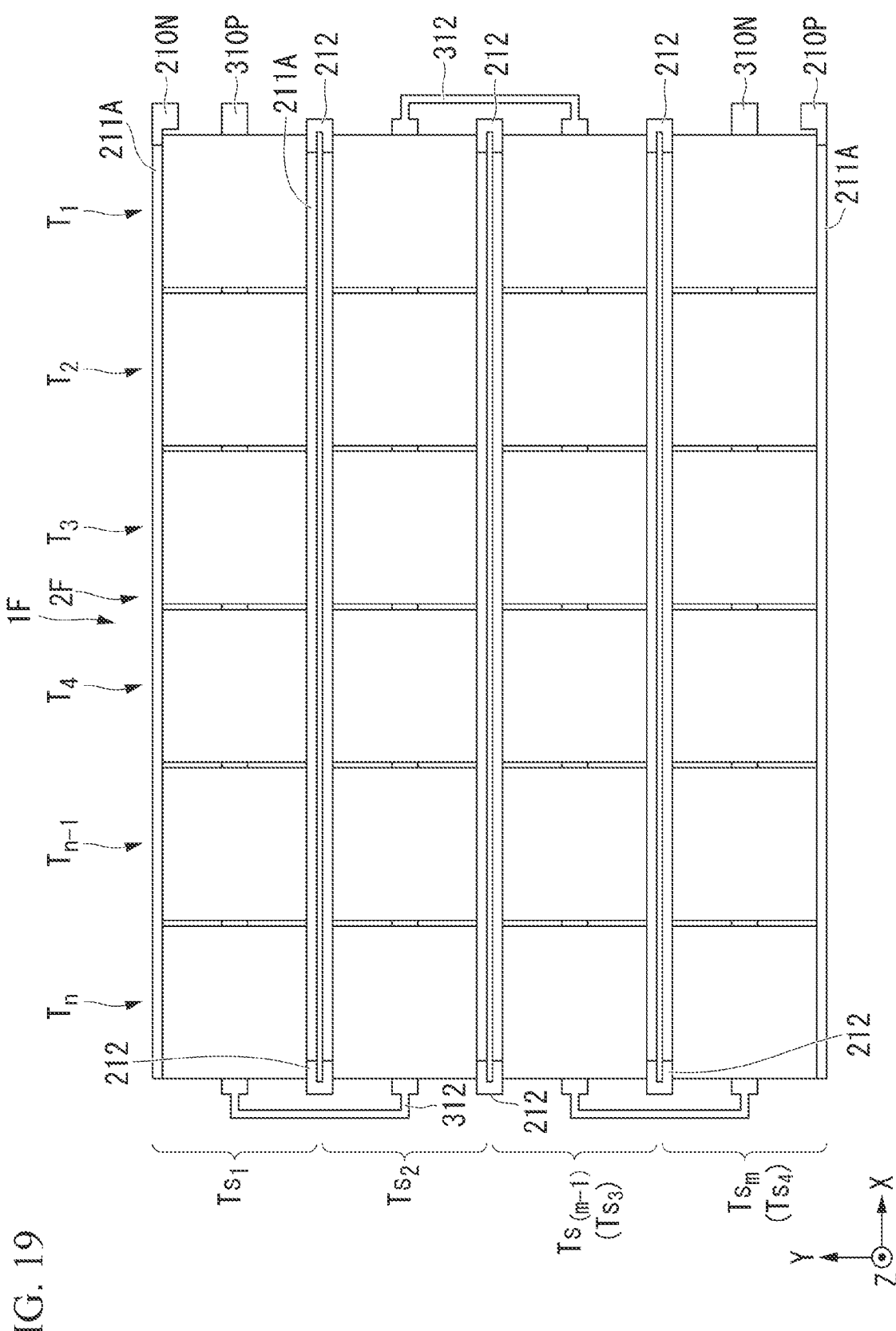
FIG. 19 is a plan view showing an example of a tandem solar cell of a fifth modification.

FIG. 19 is a plan view showing an example of a tandem solar cell of the fifth modification.

As shown in FIG. 19, the tandem solar cell 1F of this modification has a top cell module 2F instead of the top cell module 2A of the tandem solar cell 1A of the second embodiment. In the following, the points different from the second embodiment will be mainly described.

The top cell module 2F has three first string connections 212 added in addition to the first string connections 212 similar to those of the second embodiment.

The added first string connections 212 are arranged at the same positions as the respective first string connections 212 in the fourth modification.

Thus, in this modification, the top cell strings Ts1-Ts4 have the first cell connects 211A at both ends in the X-axis direction electrically connected by the first string connections 212, respectively.

That is, this modification is an example in which the tandem solar cell 1A of the second embodiment is modified in the same manner as in the second modification.

According to this modification, it is possible to provide a tandem solar cell capable of improving insulation between the top cell module and the bottom cell module with a simple configuration.

Sixth Modification

Figure 20:
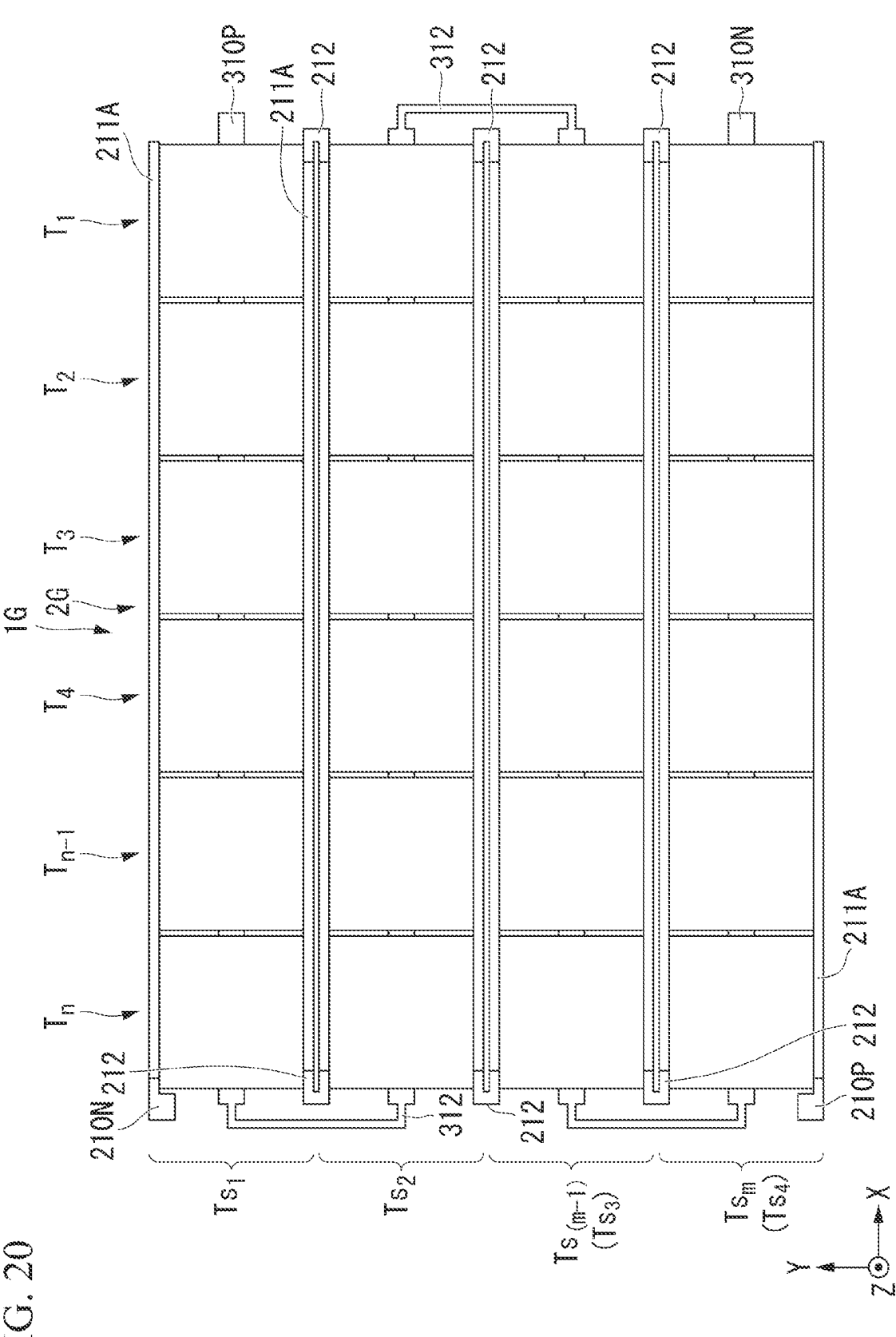
FIG. 20 is a plan view showing an example of a tandem solar cell according to a sixth modification.

FIG. 20 is a plan view showing an example of a tandem solar cell of the sixth modification.

As shown in FIG. 20, the tandem solar cell 1G of this modification has a top cell module 2G instead of the top cell module 2F of the tandem solar cell 1F of the fifth modification. Hereinafter, the points different from the fifth modification will be mainly described.

In the top cell module 2G, as in the fourth modification, the first negative terminal 210N and the first positive terminal 210P are provided on the opposite side of the second positive terminal 310P and the second negative terminal 310N in the X-axis direction, and otherwise, it is the same as the fifth modification.

According to this modification, it is possible to provide a tandem solar cell capable of improving insulation between the top cell module and the bottom cell module with a simple configuration.

Seventh Modification

Figure 21:
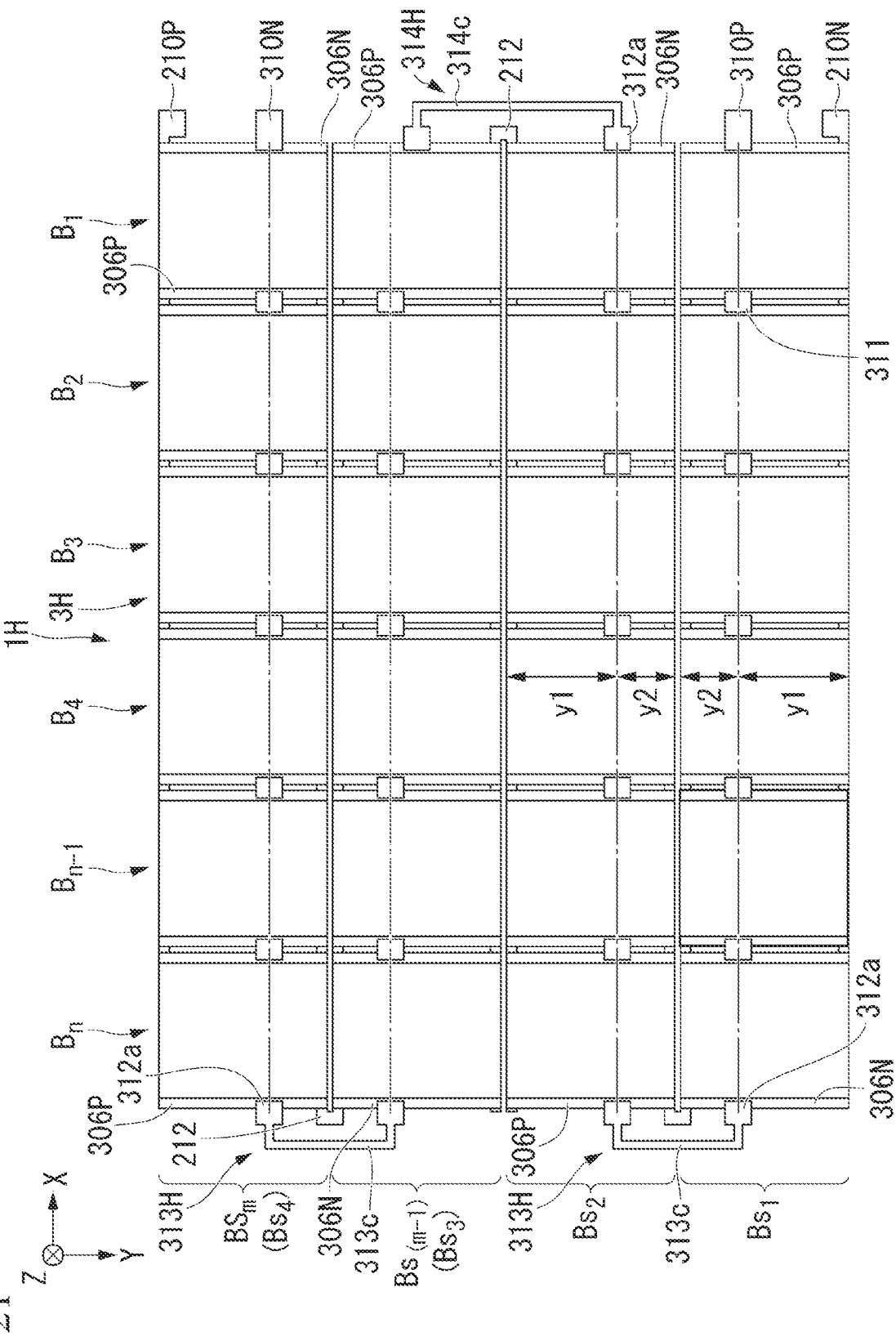
FIG. 21 is a back view showing an example of a tandem solar cell of a seventh modification.

FIG. 21 is a back view showing an example of a tandem solar cell of the seventh modification.

As shown in FIG. 21, the tandem solar cell 1H of this modification has a bottom cell module 3H instead of the bottom cell module 3 of the tandem solar cell 1 of the first embodiment. The following description will focus on the differences from the first embodiment.

Instead of the three second string connections 312, the bottom cell module 3H has two second string connections 313H and one second string connection 314H.

Each second string connection 313H is similar to the second string connection 312 except that it has a shorter length in the Y-axis direction. That is, each second string connection 313H has a linear portion 313c shorter than the linear portion 312c instead of the linear portion 312c.

Each second string connection 313H connects bottom cell strings Bs1 and Bs2 and bottom cell strings Bs3 and Bs4 in series at the end in the negative direction of the X axis.

The second string connection 314H is similar to the second string connection 312 except that it is longer in the Y-axis direction. That is, the second string connection 314H has a linear portion 314c that is longer than the linear portion 312c instead of the linear portion 312c.

The second string connection 314H connects the bottom cell strings Bs2 and Bs3 in series at the end in the positive direction of the X axis.

In the bottom cell string Bs1 according to this modification, the center line in the Y-axis direction of the connecting portion 312a on the Y-axis positive direction side of the second string connection 313H, each of the second cell connects 311, and the second positive terminal 310P extends in the X-axis direction at a distance y1 (where y1>y0/2) from the end of the bottom cell string Bs1 in the Y-axis positive direction. The distance between these center lines and the end of the bottom cell string Bs1 in the Y-axis negative direction is y2=y0−y1<y0/2.

In the bottom cell string Bs2 of this modification, the connecting portion 312a of the second string connection 313H on the Y-axis negative direction side, the Y The center line in the axial direction extends in the X-axis direction at a distance y2 from the end of the bottom cell string Bs2 in the Y-axis positive direction.

In the bottom cell string Bs3 of this modification, the connecting portion 312a of the second string connection 313H on the Y-axis positive direction side, the Y The center line in the axial direction has the same positional relationship as the bottom cell string Bs1.

In the bottom cell string Bs4 according to the present modification, the center line in the Y-axis direction of the connecting portion 312a on the Y-axis negative direction side of the second string connection 313H, each of the second cell connects 311, and the second negative electrode terminal 310N has the same positional relationship as the bottom cell string Bs2.

This modification is an example in which the connection positions of the positive electrodes 306P and the negative electrodes 306N of the bottom cells Bi are all shifted from the centers of the positive electrodes 306P and the negative electrodes 306N in the Y-axis direction.

In particular, according to this modification, the distance between the first negative electrode terminal 210N and the second positive electrode terminal 310P and the distance between the first positive electrode terminal 210P and the second negative electrode terminal 310N in the plan view can be further apart than in the first embodiment.

According to this modification, it is possible to provide a tandem solar cell capable of improving insulation between the top cell module and the bottom cell module with a simple configuration.

Eighth Modification

Figure 22:
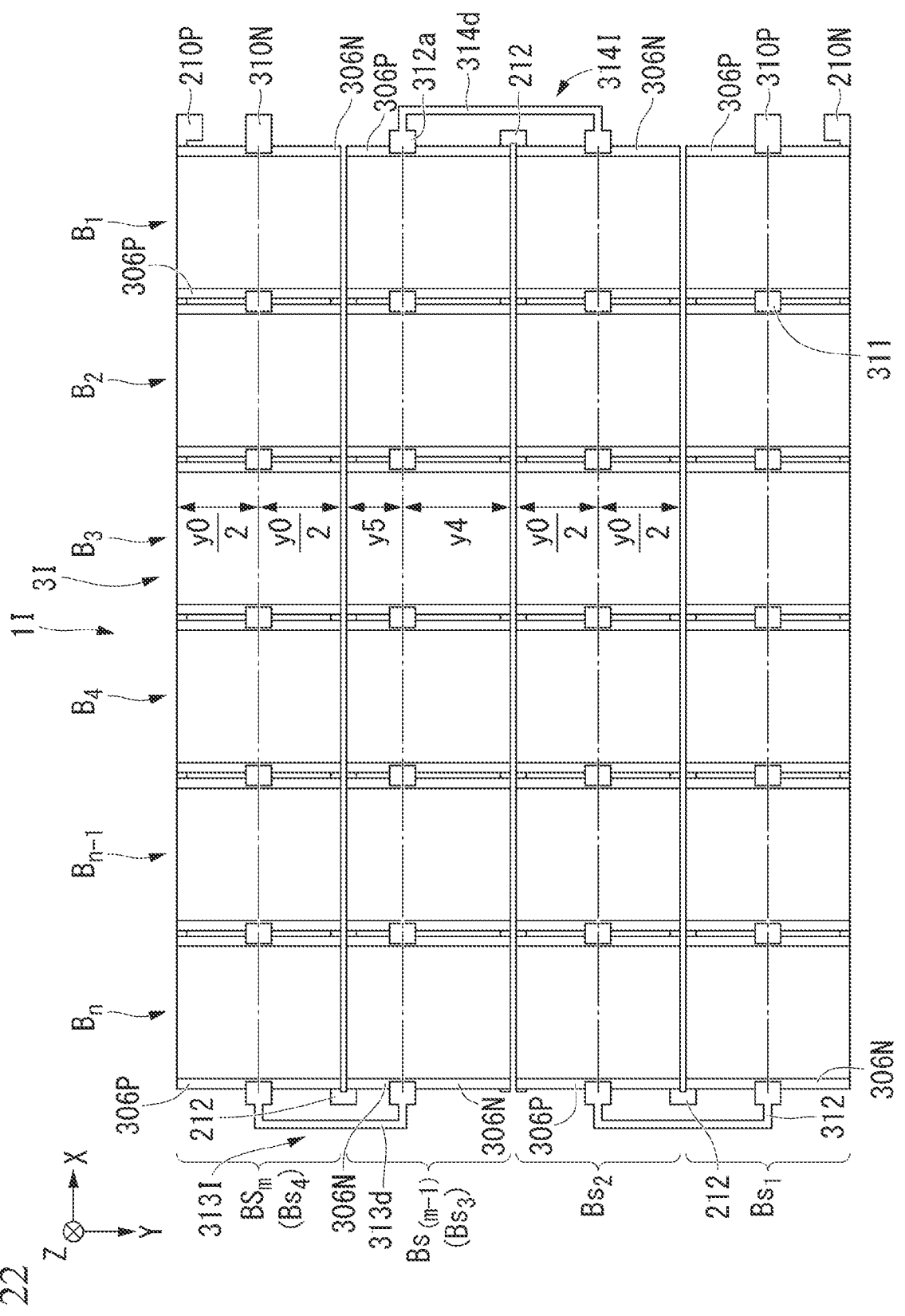
FIG. 22 is a back view showing an example of a tandem solar cell according to an eighth modification.

FIG. 22 is a back view showing an example of the tandem solar cell of the eighth modification.

As shown in FIG. 22, the tandem solar cell 1I of this modification has a bottom cell module 3I instead of the bottom cell module 3 of the tandem solar cell 1 of the first embodiment. The following description will focus on the differences from the first embodiment.

The bottom cell module 3I has second string connections 313I and 314I instead of the two second string connections 312.

The bottom cell strings Bs1 and Bs2 in this modification are connected in series by the second string connection 312 as in the first embodiment.

The second string connection 313I is similar to the second string connection 312 except that it has a shorter length in the Y-axis direction. That is, the second string connection 313I has a linear portion 313d shorter than the linear portion 312c instead of the linear portion 312c.

The second string connection 313I connects the bottom cell strings Bs3 and Bs4 in series at the end in the negative direction of the X axis.

The second string connection 314I is similar to the second string connection 312 except that it is longer in the Y-axis direction. That is, the second string connection 314I has a linear portion 314d longer than the linear portion 312c instead of the linear portion 312c.

The second string connection 314I connects the bottom cell strings Bs2 and Bs3 in series at the end in the positive direction of the X axis.

The Y-axis positive direction connecting portion 312a of the second string connection 314I is electrically connected to the negative electrode 306N of the bottom cell B1 at the center of the Y-axis direction of the negative electrode 306N.

In the bottom cell string Bs3 according to this modification, the center line in the Y-axis direction of the connecting portion 312a on the Y-axis positive direction side of the second string connection 313I, each second cell connect 311, and the connecting portion 312a on the Y-axis negative direction side of the second string connection 314I extends in the X-axis direction at a distance y4 (where y4>y0/2) from the end of the bottom cell string Bs3 in the Y-axis positive direction. The distance between these center lines and the end of the bottom cell string Bs3 in the Y-axis negative direction is y5=y0–y4<y0/2.

In the bottom cell string Bs4 of this modification, the center line in the Y-axis direction of the connecting portion 312a on the Y-axis negative direction side of the second string connection 313I, each of the second cell connects 311, and the second negative electrode terminal 310N extends in the X-axis direction at the center of the bottom cell string Bs4 in the Y-axis direction.

In this modification, the connection positions of the positive electrodes 306P and the negative electrodes 306N of the bottom cells Bi are shifted from the centers of the positive electrodes 306P and the negative electrodes 306N in the Y-axis direction only in the bottom cell string Bs3.

According to this modification, it is possible to provide a tandem solar cell capable of improving insulation between the top cell module and the bottom cell module with a simple configuration.

Several modifications applicable to each of the above-described embodiments and modifications will be described below.

In each of the above-described embodiments and modifications, the example in which the bottom cell Bi is a back-contact solar cell has been described. However, the bottom cell Bi is not limited to a back-contact solar cell. For example, the bottom cell Bi may be a crystalline silicon solar cell, a monocrystalline, polycrystalline or amorphous silicon solar cell, or a CIS or CIGS compound solar cell. Examples of crystalline silicon solar cells are described below.

Figure 23:
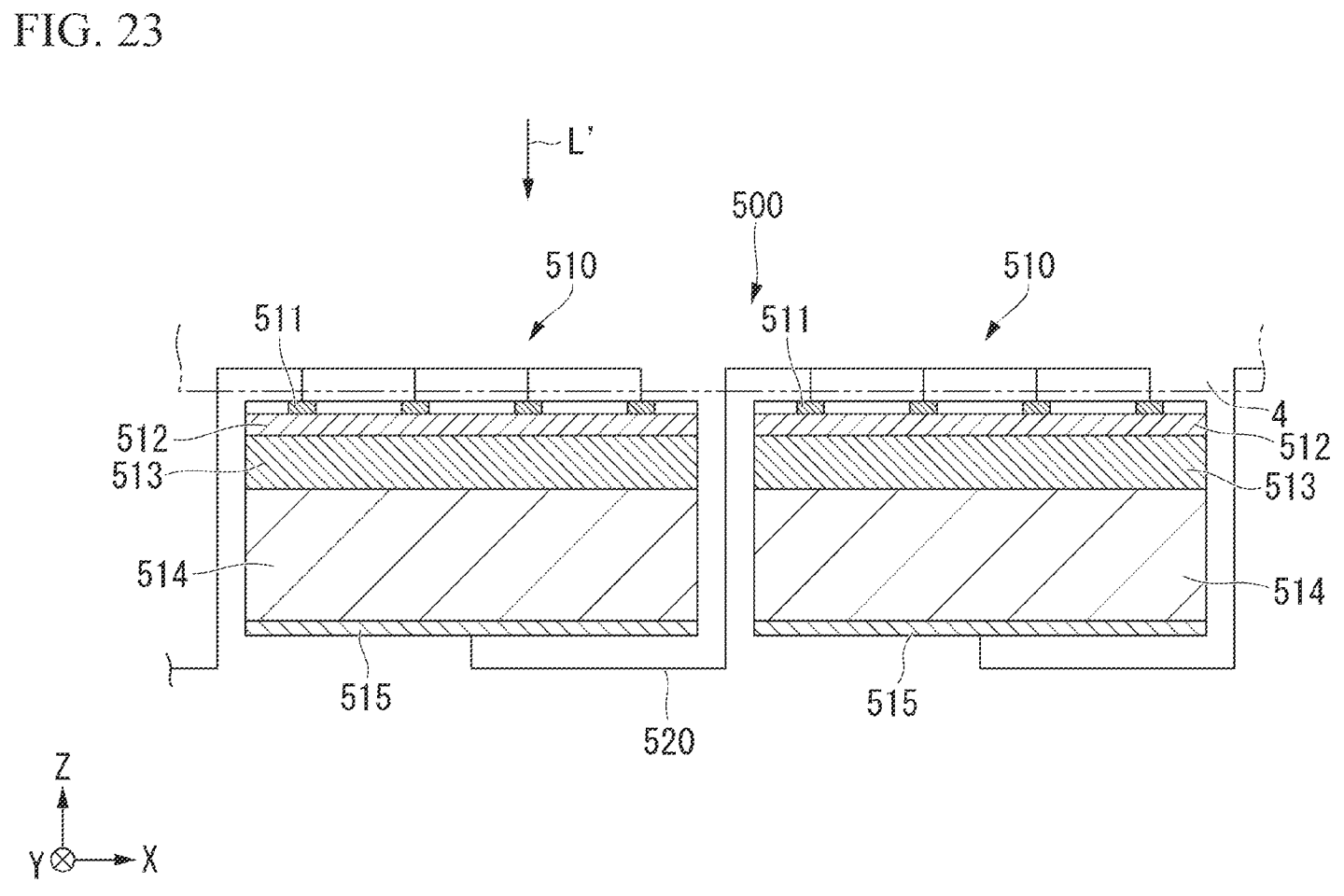

FIG. 23 is a cross-sectional view showing an example of a crystalline silicon solar cell that can be used in each embodiment and each modification.

As shown in FIG. 23, the bottom cell string 500 has a plurality of bottom cells 510 connected in series.

Each bottom cell 510 has an n-electrode 511, an antireflection film 512, an n-type semiconductor 513, a p-type semiconductor 514, and a p-electrode 515 stacked in this order in the Z-axis negative direction.

The bottom cell 510 generates a voltage between the p-type semiconductor 514 and the n-type semiconductor 513 when receiving the incident light U. The generated voltage becomes the voltage between the p-electrode 515 and the n-electrode 511.

The p-electrodes 515 and n-electrodes 511 of the bottom cells 510 adjacent to each other are electrically connected to each other by a cell interconnector 520 made of a conductor. Thereby, each bottom cell 510 of the bottom cell string 500 is connected in series. Note that FIG. 23 schematically shows the cell interconnector 520, so that it protrudes upward and downward in the thickness direction (Z-axis direction) of the bottom cell 510. Each cell interconnector 520 is arranged at any position in the thickness direction (Z-axis direction) of the bottom cell 510.

In each of the above-described embodiments and modifications, an example in which the front transparent electrode layer 205 and the back transparent electrode layer 202 are used in the top cell module has been described. However, the electrodes in the top cell module may be electrodes formed in a mesh shape and may be configured to allow light to pass through the gaps of the mesh.

A similar electrode structure can be adopted for the p-electrode 515 in the bottom cell 510.

In each of the above-described embodiments and modifications, an example in which the top cell Ti and the bottom cell Bi are rectangular in the plan view has been described. However, the connecting portions of the top cell Ti and the bottom cell Bi are not limited to rectangles. For example, a rectangular shape with rounded or rounded corners, or a polygonal shape other than a rectangular shape may be used.

In each of the above-described embodiments and modifications, an example in which the outer shape of the top cell module and the bottom cell module is rectangular has been described. However, the external shapes of the top cell module and bottom cell module are not limited to rectangles. For example, by connecting the top cell string Tsj and the bottom cell string Bsj with different lengths in the X-axis direction, shapes other than rectangles such as substantially trapezoidal and substantially polygonal shapes can be formed.

In each of the above-described embodiments and modifications, in the tandem solar cell, the example in which the first positive terminal, the first negative terminal, the second positive terminal, and the second negative terminal all form the third extending portion has been described. However, the first positive terminal, the first negative terminal, the second positive terminal, and the second negative terminal may not form the third extending portion. A first positive terminal, a first negative terminal, a second positive terminal, a second negative terminal, or a combination thereof may form the third extending portion.

In each of the above-described embodiments and modifications, an example without a bypass diode has been described. However, tandem solar cells may include bypass diodes.

In the third embodiment described above, an example of a tandem solar cell in which a plurality of tandem modules are connected in series has been described. However, the connection of multiple tandem modules is not limited to series connection. For example, a plurality of tandem modules may be connected only in parallel or may be connected in series and in parallel.

In the third embodiment, the tandem solar cell Sb1 is provided with the first negative electrode terminal 20N and the second positive electrode terminal 30P, and the tandem solar cell Sb6 is provided with the first positive electrode terminal 20P and the second negative electrode terminal 30N. However, the first negative terminal 20N, the first positive terminal 20P, the second positive terminal 30P, and the second negative terminal 30N may be provided in any of the plurality of tandem modules according to the connection form of the plurality of tandem modules.

In the third embodiment described above, an example in which a plurality of tandem modules all have the same configuration as the tandem solar cell 1 has been described. However, the plurality of tandem modules may include tandem modules of different configurations. For example, the tandem module may include the tandem solar cell of the second embodiment described above, the tandem solar cells of the first to eighth modifications, or other tandem solar cells.

In the third embodiment described above, each of the tandem modules has four external output terminals, the first positive terminal 20P, the first negative terminal 20N, the second positive terminal 30P, and the second negative terminal. An example in which the external output terminals other than the terminal 30N are electrically connected has been described. That is, in the third embodiment, independently usable tandem solar cells are configured as a plurality of tandem modules. However, the plurality of tandem modules may be configured without four external output terminals that can be used independently. That is, the plurality of tandem modules need not have external output terminals other than the first positive terminal 20P, the first negative terminal 20N, the second positive terminal 30P, and the second negative terminal 30N.

According to at least one embodiment described above, a top cell string in which a plurality of top cells are electrically connected, a bottom cell string which is arranged so as to overlap the top cell string in a plan view in a thickness direction of the top cells, and in which a plurality of bottom cells are electrically connected, a top cell module in which a plurality of the top cell strings are electrically connected, a first string connection which has a first extending portion extending to an outside of the top cell module in the plan view, a bottom cell module in which a plurality of the bottom cell strings are electrically connected, and a second string connection which has a second extending portion extending to an outside of the bottom cell module in the plan view are provided, and the first extending portion and the second extending portion are arranged apart from each other in the plan view. Therefore, it is possible to provide a tandem solar cell capable of improving insulation between the top cell module and the bottom cell module with a simple configuration.

Although several embodiments of the invention have been described, these embodiments are presented as examples and are not intended to limit the scope of the invention. These embodiments can be implemented in various other forms, and various omissions, replacements, and modifications can be made without departing from the scope of the invention. These embodiments and their modifications are included in the scope and spirit of the invention, as well as the scope of the invention described in the claims and equivalents thereof

What is claimed is:

1. A tandem solar cell, comprising:
a top cell string in which a plurality of top cells are electrically connected;
a bottom cell string which is arranged so as to overlap the top cell string in a plan view in a thickness direction of the plurality of top cells, and in which a plurality of bottom cells are electrically connected;
a top cell module in which a plurality of top cell strings, including the top cell string, are electrically connected;
a first string connection which has a first extending portion extending to an outside of the top cell module in the plan view;
a bottom cell module in which a plurality of bottom cell strings, including the bottom cell string, are electrically connected; and
a second string connection which has a second extending portion extending to an outside of the bottom cell module in the plan view,
wherein the first extending portion and the second extending portion are arranged apart from each other in the plan view,
the top cell module and the bottom cell module are electrically separated from each other,
a first pair of the top cell strings, including the top cell string, of the plurality of top cell strings, are electrically connected to one another by the first extending portion, and a second pair of the bottom cell strings, including the bottom cell string, of the plurality of bottom cell strings, overlapping the first pair of the top cell strings respectively in the plan view, are electrically connected to one another by the second extending portion.

2. The tandem solar cell according to claim 1, further comprising:
a first positive electrode terminal which is electrically connected to a positive electrode of the top cell module;
a first negative electrode terminal which is electrically connected to a negative electrode of the top cell module;
a second positive electrode terminal which is electrically connected to a positive electrode of the bottom cell module; and
a second negative electrode terminal which is electrically connected to a negative electrode of the bottom cell module,
wherein the first positive terminal, the first negative terminal, the second positive terminal, the second negative terminal, or a combination thereof, has a third extending portion extending to the outside of the top cell module or the outside of the bottom cell module in the plan view, and
wherein the third extending portion is arranged apart from both the first extending portion and the second extending portion in the plan view.

3. The tandem solar cell according to claim 1, wherein the plurality of top cells are provided in a same number as the plurality of bottom cells, and each of the plurality of top cells is arranged to face one of the plurality of bottom cells in the thickness direction.

4. The tandem solar cell according to claim 1, wherein the top cell string has a first electrode portion provided on a first surface opposite to a second surface facing the bottom cell string, and the plurality of top cell strings are electrically connected by the first electrode portion.

5. The tandem solar cell according to claim 1, wherein each of the plurality of top cells has a first cell electrode provided on a first surface opposite to a second surface facing the plurality of bottom cells, and the plurality of top cells in each of the plurality of top strings are electrically connected to each other at the first cell electrode.

6. The tandem solar cell according to claim 5, further comprising:
a first cell connect which electrically connects the first cell electrodes of the plurality of top cells in each of the plurality of top cell strings,
wherein the plurality of top cells in each of the plurality of top cell strings are connected in parallel by the first cell connect, and
wherein the plurality of top cell strings are connected in series by electrically connecting top cell strings, of the plurality of top cell strings, that are arranged adjacent to each other in the plan view among the plurality of top cell strings by the first string connection.

7. The tandem solar cell according to claim 1, wherein the plurality of bottom cell strings have second electrode portions provided on a first surface opposite to a second surface facing the plurality of top cell strings, and the plurality of bottom cell strings are electrically connected by the second electrode portions.

8. The tandem solar cell according to claim 1, wherein each of the plurality of bottom cells has a second cell electrode provided on a first surface opposite to a second surface facing the plurality of top cells, and the plurality of bottom cells in each of the plurality of bottom cell strings are electrically connected to each other at the second cell electrode.

9. The tandem solar cell according to claim 8, further comprising:
a second cell connect which electrically connects the second cell electrodes of the plurality of bottom cells in each of the plurality of bottom cell strings,
wherein the plurality of bottom cells in each of the plurality of bottom cell strings are connected in series by the second cell connect, and
wherein the plurality of bottom cell strings are connected in series by electrically connecting plurality of bottom cell strings, of the plurality of bottom cell strings, that are arranged adjacent to each other in the plan view among the plurality of bottom cell strings by the second string connection.

10. The tandem solar cell according to claim 1, wherein the second extending portion is longer than the first extending portion.

11. The tandem solar cell according to claim 1, wherein the first extending portion and the second extending portion are arranged adjacent to each other in an arrangement direction of the plurality of top cell strings in the plan view without overlapping in the plan view.

12. The tandem solar cell according to claim 1, wherein the second extending portion is arranged to surround the first extending portion from the outside in the plan view.

13. The tandem solar cell according to claim 1, wherein
the top cell module and the bottom cell module have a plurality of tandem modules overlapping in a thickness direction,
the top cell module in each of the plurality of tandem modules are electrically connected to each other,
the bottom cell module in each of the plurality of tandem modules are electrically connected to each other,
a positive electrode terminal for extracting an overall power output of the top cell module is a first positive electrode terminal electrically connected to a positive electrode of the top cell module in any one of the plurality of tandem modules,
a negative electrode terminal for extracting the overall power output of the top cell module is a first negative electrode terminal electrically connected to a negative electrode of the top cell module in any one of the plurality of tandem modules,
a positive electrode terminal for extracting an overall power output of the bottom cell module is a second positive electrode terminal electrically connected to a positive electrode of the bottom cell module in any one of the plurality of tandem modules, and
a negative electrode terminal for extracting the overall power output of the entire bottom cell module is a second negative electrode terminal electrically connected to a negative electrode of the bottom cell module in any one of the plurality of tandem modules.

14. The tandem solar cell according to claim 1, wherein two of the plurality of top cell strings are electrically connected by the first string connection, and two of the plurality of bottom cell strings are electrically connected by the second string connection.

15. The tandem solar cell according to claim 1, wherein the top cell module and the bottom cell module are electrically separated from each other within a volume of the overlapping top cell module and the bottom cell module that extends between a top surface of the top cell module and a bottom surface of the bottom cell module in the plan view.

16. The tandem solar cell according to claim 15, wherein the top cell module and the bottom cell module omit conductive connections conductively connecting the top cell module and the bottom cell module between the top cell module and the bottom cell module and omit conductive connections conductively connecting the top cell module and the bottom cell module extending along outer surfaces of the top cell module and the bottom cell module.

17. The tandem solar cell according to claim 1, wherein the top cell module and the bottom cell module omit conductive connections conductively connecting the top cell module and the bottom cell module between the top cell module and the bottom cell module and omit conductive connections conductively connecting the top cell module and the bottom cell module extending along outer surfaces of the top cell module and the bottom cell module.

18. The tandem solar cell according to claim 1, wherein the top cell strings of the first pair of the top cell strings are aligned adjacent one another absent another top cell string disposed therebetween, and the bottom cell strings of the second pair of the bottom cell strings are aligned adjacent one another absent another bottom cell string disposed therebetween.

19. A tandem solar cell, comprising:
a top cell string in which a plurality of top cells are electrically connected;
a bottom cell string which is arranged so as to overlap the top cell string in a plan view in a thickness direction of the plurality of top cells, and in which a plurality of bottom cells are electrically connected;
a top cell module in which a plurality of top cell strings, including the top cell string, are electrically connected;
a first string connection which has a first extending portion extending to an outside of the top cell module in the plan view;
a bottom cell module in which a plurality of bottom cell strings, including the bottom cell string, are electrically connected; and
a second string connection which has a second extending portion extending to an outside of the bottom cell module in the plan view,
wherein the first extending portion and the second extending portion are arranged apart from each other in the plan view,
the top cell module and the bottom cell module are electrically separated from each other,
two adjacent ones of the plurality of top cell strings, including the top cell string, are electrically connected to one another by the first extending portion, and two adjacent ones of the plurality of bottom cell strings, including the bottom cell string, are electrically connected to one another by the second extending portion,
the adjacent ones of the plurality of top cell strings are aligned adjacent one another absent another top cell string disposed therebetween, and
the adjacent ones of the plurality of bottom cell strings are aligned adjacent one another absent another bottom cell string disposed therebetween.

20. The tandem solar cell according to claim 19, wherein the top cell module and the bottom cell module omit conductive connections conductively connecting the top cell module and the bottom cell module between the top cell module and the bottom cell module and omit conductive connections conductively connecting the top cell module and the bottom cell module extending along outer surfaces of the top cell module and the bottom cell module.

* * * * *